(12) United States Patent
Shimada et al.

(10) Patent No.: US 9,412,931 B2
(45) Date of Patent: Aug. 9, 2016

(54) PIEZOELECTRIC CERAMICS, PIEZOELECTRIC ELEMENT, LIQUID EJECTION HEAD, ULTRASONIC MOTOR, AND DUST REMOVING DEVICE

(71) Applicant: CANON KABUSHIKI KAISHA, Tokyo (JP)

(72) Inventors: Mikio Shimada, Tokyo (JP); Toshiaki Aiba, Fujisawa (JP); Toshihiro Ifuku, Yokohama (JP); Takanori Matsuda, Chofu (JP); Makoto Kubota, Yokohama (JP); Tatsuo Furuta, Machida (JP); Jumpei Hayashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 97 days.

(21) Appl. No.: 14/380,002

(22) PCT Filed: Mar. 26, 2013

(86) PCT No.: PCT/JP2013/059801
§ 371 (c)(1),
(2) Date: Aug. 20, 2014

(87) PCT Pub. No.: WO2013/147295
PCT Pub. Date: Oct. 3, 2013

(65) Prior Publication Data
US 2015/0028249 A1    Jan. 29, 2015

(30) Foreign Application Priority Data

Mar. 30, 2012 (JP) .................. 2012-081216

(51) Int. Cl.
| H01L 41/187 | (2006.01) |
| B08B 7/02 | (2006.01) |
| B41J 2/14 | (2006.01) |
| C04B 35/468 | (2006.01) |
| H01L 41/083 | (2006.01) |
| H02N 2/10 | (2006.01) |
| H02N 2/16 | (2006.01) |
| G02B 7/02 | (2006.01) |
| C04B 35/626 | (2006.01) |
| G03B 3/10 | (2006.01) |
| B41J 2/045 | (2006.01) |
| G02B 27/00 | (2006.01) |
| H01L 41/047 | (2006.01) |
| H02N 2/00 | (2006.01) |

(52) U.S. Cl.
CPC ............ *H01L 41/1871* (2013.01); *B08B 7/028* (2013.01); *B41J 2/045* (2013.01); *B41J 2/14233* (2013.01); *C04B 35/4682* (2013.01); *C04B 35/62645* (2013.01); *G02B 7/021* (2013.01); *G02B 7/022* (2013.01); *G02B 7/023* (2013.01); *G02B 27/0006* (2013.01); *G03B 3/10* (2013.01); *H01L 41/0471* (2013.01); *H01L 41/083* (2013.01); *H02N 2/001* (2013.01); *H02N 2/106* (2013.01); *H02N 2/163* (2013.01); *B41J 2202/03* (2013.01); *C04B 2235/3208* (2013.01); *C04B 2235/3236* (2013.01); *C04B 2235/3244* (2013.01); *C04B 2235/3248* (2013.01); *C04B 2235/3262* (2013.01); *C04B 2235/3263* (2013.01); *C04B 2235/449* (2013.01); *C04B 2235/5436* (2013.01); *C04B 2235/5445* (2013.01); *C04B 2235/5454* (2013.01); *C04B 2235/6562* (2013.01); *C04B 2235/6567* (2013.01); *C04B 2235/786* (2013.01); *C04B 2235/80* (2013.01); *G03B 2205/0061* (2013.01); *G03B 2205/0084* (2013.01)

(58) Field of Classification Search
CPC ............ C04B 35/4682; H01L 41/1871; H01L 41/083; H01L 41/0471; B41J 2/14233; B41J 2/045; B08B 7/028; G02B 27/0006; H02N 2/001
See application file for complete search history.

(56) References Cited

U.S. PATENT DOCUMENTS

| 4,988,468 A * | 1/1991 | Nishioka ............. H01G 4/1245 264/658 |
| 6,093,338 A | 7/2000 | Tani et al. |

(Continued)

FOREIGN PATENT DOCUMENTS

| CN | 101971381 A | 2/2011 |
| CN | 102153344 A | 8/2011 |

(Continued)

OTHER PUBLICATIONS

Communication Pursuant to Article 94(3) EPC in European Application No. 13716074.3 (dated May 29, 2015).

(Continued)

*Primary Examiner* — Carol M Koslow
(74) *Attorney, Agent, or Firm* — Fitzpatrick, Cella, Harper & Scinto

(57) ABSTRACT

Provided is a lead-free piezoelectric ceramics having enhanced mechanical quality factor (Qm) and mechanical strength. The piezoelectric ceramics, includes at least a first crystal grain and a second crystal grain. The first crystal grain has an average equivalent circle diameter of 2 μm or more and 30 μm or less. The first crystal grain includes a perovskite-type metal oxide represented by the following general formula (1) as a main component, and the second crystal grain includes a perovskite-type metal oxide represented by the following general formula (2) as a main component: (1) $xBaTiO_3\text{-}yCaTiO_3\text{-}zCaZrO_3$; and (2) $x'BaTiO_3\text{-}y'CaTiO_3\text{-}z'CaZrO_3$, provided that x, y, z, x', y', and z' satisfy $x+y+z=1$, $x'+y'+z'=1$, $0 \leq x' \leq 0.15$, $0.85 \leq y' \leq 1$, $0 \leq z \leq 0.05$, $x > x'$, $0 < y < y'$, and $z > 0$.

26 Claims, 13 Drawing Sheets

(56) References Cited

U.S. PATENT DOCUMENTS

| | | |
|---|---|---|
| 8,034,250 B2 | 10/2011 | Hayashi et al. |
| 8,182,713 B2 | 5/2012 | Xiaobing et al. |
| 8,846,556 B2 | 9/2014 | Kubota et al. |
| 9,130,168 B2 | 9/2015 | Kubota et al. |
| 2011/0037811 A1 | 2/2011 | Wang |

FOREIGN PATENT DOCUMENTS

| | | |
|---|---|---|
| JP | 11-60333 A | 3/1999 |
| JP | 2007-246347 A | 9/2007 |
| JP | 4039029 B2 | 1/2008 |
| JP | 2009-215111 A | 9/2009 |
| WO | 2009/116683 A1 | 9/2009 |

OTHER PUBLICATIONS

Annie Simon et al., "New Lead-Free Non-Stoichiometric Perovskite Relaxor Ceramics Derived from BaTiO3," 5 (11-12) Solid State Sci. 1459-1464 (Nov.-Dec. 2003).

First Office Action in Chinese Application No. 201380016696.0 (notified May 4, 2016).

* cited by examiner

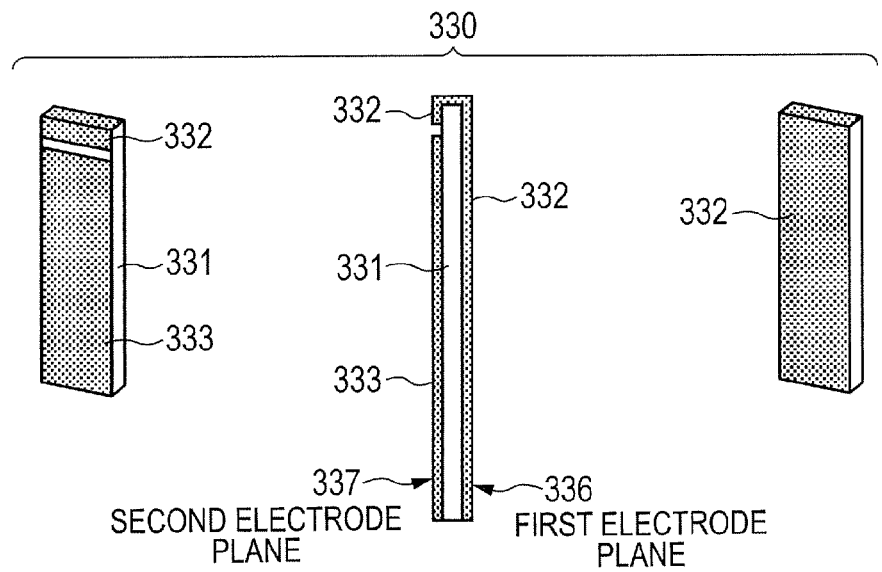
FIG. 10A  FIG. 10B  FIG. 10C
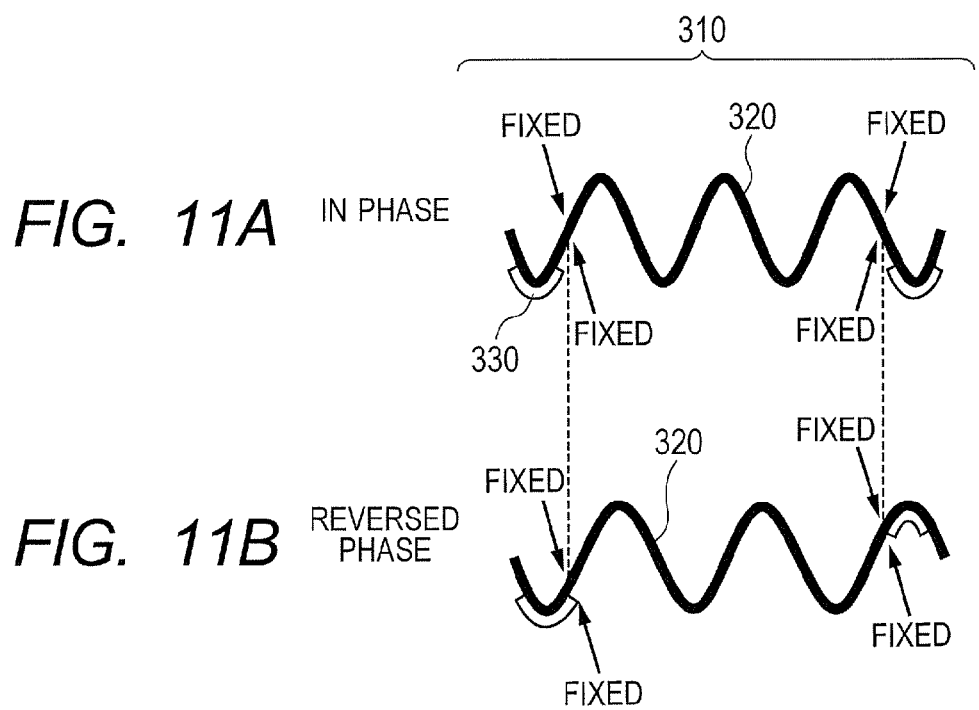
FIG. 11A  IN PHASE
FIG. 11B  REVERSED PHASE

PIEZOELECTRIC CERAMICS, PIEZOELECTRIC ELEMENT, LIQUID EJECTION HEAD, ULTRASONIC MOTOR, AND DUST REMOVING DEVICE

TECHNICAL FIELD

The present invention relates to a piezoelectric ceramics. Further, the present invention relates to a piezoelectric element, a multilayered piezoelectric element, a liquid ejection head, a liquid ejection apparatus, an ultrasonic motor, an optical equipment, a vibration device, a dust removing device, an imaging apparatus, and an electronic equipment, which each use the piezoelectric ceramics. In particular, the present invention relates to a lead-free piezoelectric ceramics having enhanced mechanical quality factor (Qm) and mechanical strength by causing a second crystal grain to coexist.

BACKGROUND ART

As a piezoelectric material, a lead-based piezoelectric ceramics such as lead titanate zirconate (hereinafter referred to as "PZT") having a perovskite structure is generally used.

However, the PZT contains lead in the A site of the perovskite structure. Therefore, influence of lead on environment is a matter of concern. In order to address this problem, there has been proposed a piezoelectric material which uses a perovskite-type metal oxide containing no lead.

As a representative lead-free perovskite-type piezoelectric material, there is known barium titanate represented by general formula $BaTiO_3$ (hereinafter referred to as "BTO").

However, BTO has a phase transition temperature (orthorhombic-to-tetragonal phase transition temperature) in the vicinity of 0° C. to 10° C. Therefore, there has been a disadvantage that, depending on the use temperature, the piezoelectric property significantly varies. Various attempts have been made to eliminate this disadvantage.

For example, PTL 1 discloses a BTO ceramics in which the phase transition influence is reduced by doping Ca to BTO to shift the phase transition temperature to the lower temperature side. However, the piezoelectric property is degraded and the mechanical quality factor (Qm) is reduced as compared to those of BTO.

Further, PTL 2 discloses a BTO ceramics in which piezoelectricity is enhanced by doping Ca and Zr to BTO. However, the Curie temperature is 80° C. or less, and hence there has been a problem in that depolarization easily occurs under high-temperature environment. Further, the mechanical quality factor (Qm) is low.

Further, in general, pores are liable to be formed in the BTO ceramics, and hence there has been a problem in that the mechanical strength is not sufficient.

As described above, the BTO ceramics has had a problem in that the Qm and the mechanical strength are not sufficient.

CITATION LIST

Patent Literature

PTL 1: Japanese Patent No. 4039029
PTL 2: Japanese Patent Application Laid-Open No. 2009-215111

SUMMARY OF INVENTION

Technical Problem

The present invention has been accomplished to solve such problems, and provides a lead-free piezoelectric ceramics having enhanced Qm and mechanical strength. Further, the present invention provides a piezoelectric element and a multilayered piezoelectric element, which each use the piezoelectric ceramics. Still further, the present invention provides a liquid ejection head, a liquid ejection apparatus, an ultrasonic motor, an optical equipment, a vibration device, a dust removing device, an imaging apparatus, and an electronic equipment, which each use the piezoelectric element or the multilayered piezoelectric element.

Solution to Problem

A piezoelectric ceramics for solving the above-mentioned problems includes at least a first crystal grain and a second crystal grain, in which the first crystal grain has an average equivalent circle diameter of 2 μm or more and 30 μm or less, and in which the first crystal grain includes a perovskite-type metal oxide represented by the following general formula (1) as a main component, and the second crystal grain includes a perovskite-type metal oxide represented by the following general formula (2) as a main component:

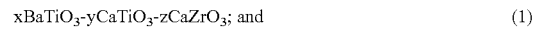

$xBaTiO_3\text{-}yCaTiO_3\text{-}zCaZrO_3$; and (1)

$x'BaTiO_3\text{-}y'CaTiO_3\text{-}z'CaZrO_3$, (2)

provided that x, y, z, x', y', and z' satisfy $x+y+z=1$, $x'+y'+z'=1$, $0<x'<0.15$, $0.85<y'<1$, $0<z'<0.05$, $x>x'$, $0<y<y'$, and $z>0$.

When the piezoelectric ceramics is polished, a ratio of an area of the first crystal grain in a polished surface of the piezoelectric ceramics is larger than a ratio of an area of the second crystal grain in the polished surface.

A piezoelectric element for solving the above-mentioned problems includes at least: a first electrode; a piezoelectric ceramics; and a second electrode, in which the piezoelectric ceramics includes the above-mentioned piezoelectric ceramics.

A multilayered piezoelectric element for solving the above-mentioned problems includes a piezoelectric ceramic layer and an electrode layer including an internal electrode, which are alternately stacked, in which the piezoelectric ceramic layer is formed of the above-mentioned piezoelectric ceramics.

A liquid ejection head includes at least: a liquid chamber including a vibration portion including one of the above-mentioned piezoelectric element and the above-mentioned multilayered piezoelectric element; and an ejection orifice communicating to the liquid chamber.

A liquid ejection apparatus for solving the above-mentioned problems includes: a conveying unit for a recording medium; and the above-mentioned liquid ejection head.

An ultrasonic motor for solving the above-mentioned problems includes at least: a vibration body including one of the above-mentioned piezoelectric element and the above-mentioned multilayered piezoelectric element; and a moving body to be brought into contact with the vibration body.

An optical equipment for solving the above-mentioned problems includes a drive unit including the above-mentioned ultrasonic motor.

A vibration device for solving the above-mentioned problems includes a vibration body including one of the above-mentioned piezoelectric element and the above-mentioned multilayered piezoelectric element.

A dust removing device for solving the above-mentioned problems includes the above-mentioned vibration device.

An electronic equipment for solving the above-mentioned problems includes a piezoelectric acoustic component including one of the above-mentioned piezoelectric element and the above-mentioned multilayered piezoelectric element.

Advantageous Effects of Invention

The present invention can provide the lead-free piezoelectric ceramics having enhanced Qm and mechanical strength by causing a second crystal grain to coexist in pores.

Further, the present invention can provide the piezoelectric element and the multilayered piezoelectric element, which each use the piezoelectric ceramics.

Still further, the present invention can provide the liquid ejection head, the liquid ejection apparatus, the ultrasonic motor, the optical equipment, the vibration device, the dust removing device, the imaging apparatus, and the electronic equipment, which each use the piezoelectric element or the multilayered piezoelectric element.

Further features of the present invention will become apparent from the following description of exemplary embodiments with reference to the attached drawings.

BRIEF DESCRIPTION OF DRAWINGS

FIGS. 10A, 10B and 10C are schematic diagrams illustrating a configuration of a piezoelectric element in the dust removing device of the present invention.

FIGS. 11A and 11B are schematic diagrams illustrating the vibration principle of the dust removing device of the present invention.

DESCRIPTION OF EMBODIMENTS

Figure 1:
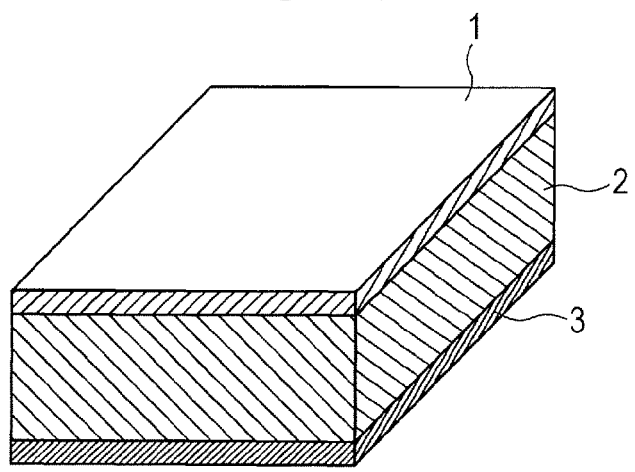
FIG. 1 is a schematic diagram illustrating a configuration of a piezoelectric element according to an embodiment of the present invention.

In the following, embodiments of the present invention are described in detail.

A piezoelectric ceramics for solving the above-mentioned problems includes at least a first crystal grain and a second crystal grain, in which the first crystal grain has an average equivalent circle diameter of 2 μm or more and 30 μm or less, and in which the first crystal grain includes a perovskite-type metal oxide represented by the following general formula (1) as a main component, and the second crystal grain includes a perovskite-type metal oxide represented by the following general formula (2) as a main component:

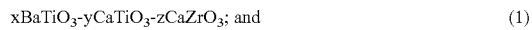

$$xBaTiO_3\text{-}yCaTiO_3\text{-}zCaZrO_3; \text{ and} \quad (1)$$

$$x'BaTiO_3\text{-}y'CaTiO_3\text{-}z'CaZrO_3, \quad (2)$$

provided that x, y, z, x', y', and z' satisfy $x+y+z=1$, $x'+y'+z'=1$, $0 \leq x' \leq 0.15$, $0.85 \leq y' \leq 1$, $0 \leq z' \leq 0.05$, $x > x'$, $0 < y < y'$, and $z > 0$.

The term "ceramics" herein employed refers to an aggregate (also referred to as bulk) of crystal grains sintered by thermal treatment, or the so-called polycrystal, in which the main component thereof is a metal oxide. The term also includes one processed after sintering. However, the term does not include any powder, powder-dispersed slurry, or a compact before thermal treatment.

The term "main component" herein employed means that the major component of the first crystal grain to exert the piezoelectric property is the perovskite-type metal oxide represented by the general formula (1), and that the major component of the second crystal grain is the perovskite-type metal oxide represented by the general formula (2).

As components other than the main component, for example, a property adjuster such as manganese or an impurity component, which is inevitably incorporated during production, may be incorporated in small amount.

Specifically, the content of the main component incorporated in the crystal grain is 95% by mass or more, preferably 97% by mass or more, more preferably 99% by mass or more and 99.96% by mass or less. It is desired that the components other than the main component incorporated in the crystal grain be kept less than 5% by mass. When the component that does not contribute to the piezoelectric property exceeds 5% by mass, the piezoelectricity of the entire piezoelectric ceramics may become insufficient.

In the general formula (1), the molar ratio between a metal element and oxygen is represented by a stoichiometric composition of 2:3, but may be represented by a non-stoichiometric composition and include an oxygen vacancy. That is, it is only required that, when $O_3$ representing oxygen in the general formula (1) is substituted with $O_{3-\delta}$, $\delta$ is less than 0.5. $\delta$ is preferably less than 0.2, more preferably less than 0.1.

Similarly, in the general formula (2), the molar ratio between a metal element and oxygen is represented by a stoichiometric composition of 2:3, but may be represented by a non-stoichiometric composition and include an oxygen vacancy. That is, it is only required that, when $O_3$ representing oxygen in the general formula (2) is substituted with $O_{3-\delta}$, $\delta$ is less than 0.5. $\delta$ is preferably less than 0.2, more preferably less than 0.1.

The term "equivalent circle diameter" herein employed refers to a "projected area equivalent circle diameter" that is generally mentioned in a microscopic observation method and indicates a diameter of a perfect circle having the same area as a projected area of the crystal grain. In the present invention, the method of measuring the equivalent circle diameter is not limited particularly. For example, the equivalent circle diameter can be determined by photographing a surface of the piezoelectric ceramics using a scanning electron microscope (SEM), and by performing image processing on the obtained photographic image. The first crystal grain and the second crystal grain have different compositions. Therefore, the intensity of the secondary electron or backscattered electron is different therebetween, and hence the first crystal grain and the second crystal grain can be discriminated from each other. Further, the equivalent circle diameter may be determined from an image of a polished surface or a cross section instead of the surface of the ceramics.

When the average equivalent circle diameter of the first crystal grain is smaller than 2 µm, the piezoelectric property may not be sufficient. On the other hand, when the average equivalent circle diameter thereof is larger than 30 µm, the mechanical strength may be reduced.

If the piezoelectric ceramics includes merely the first crystal grain, many pores are formed inside the grain, at the grain boundary, and at the triple junction.

Therefore, the mechanical strength is not sufficient. When the second crystal grain coexists, the pore is filled with the second crystal grain. With this, the mechanical strength is enhanced. In general, it is considered that the fracture phenomenon of the ceramics is mainly caused by concentration of stress to the internal crack.

When a crack exits inside the material, stress locally concentrates at the peripheral portion of the crack. Fracture occurs at the stress-concentrated position, and the crack develops. Stress locally concentrates similarly at the peripheral portion of the developed crack, and hence the crack further develops. The crack development progresses in this way, and the entire material is finally fractured.

Similarly to the crack, the pore also becomes a position at which stress locally concentrates, and hence a ceramics having pores is not sufficient in mechanical strength. Therefore, by producing a ceramics without pores, no local stress concentration occurs, and the mechanical strength is enhanced. The pore is liable to be formed between large crystal grains. That is, when merely crystal grains having the same composition exist, the crystal growth rate of the individual crystal grains is uniform, and hence the pore is liable to be formed. It has been found that, when crystal grains having different crystal growth rates coexist, pores can be filled, and thus the present invention has been completed. Further, in a ceramics, there is a case where a crack develops along the grain boundary (grain boundary fracture). When the second crystal grain exists at the grain boundary, the crack development can be prevented to prevent the grain boundary fracture. Therefore, it is considered that the mechanical strength is enhanced.

As described above, it is considered that the pore is filled with the second crystal grain, and thus the mechanical strength is enhanced.

In the piezoelectric ceramics of the present invention, the composition of the second crystal grain satisfies $0 \leq x' \leq 0.15$, $0.85 \leq y' \leq 1$, and $0 \leq z' \leq 0.05$. When the composition satisfies the above-mentioned ranges, that is, when the composition is $CaTiO_3$ rich, the second crystal grain is likely to coexist at a pore portion which is generated when merely the first crystal grain is used. With this, the density of the ceramics body is enhanced, and the Qm and the mechanical strength of the piezoelectric ceramics are enhanced.

Further, the compositions of the first crystal grain and the second crystal grain have relationships represented by $x > x'$, $0 < y < y'$, and $z > 0$. When those relationships are not satisfied, the piezoelectric property of the first crystal grain is degraded. Along therewith, the piezoelectric ceramics does not exert a sufficient piezoelectric property. It is more desired that the composition of the first crystal grain be set so that x, y, and z satisfy $0.80 \leq x \leq 0.90$, $0.04 \leq y \leq 0.12$, and $0.04 \leq z \leq 0.10$, respectively.

There is no particular limit to a method of measuring the compositions of the first crystal grain and the second crystal grain. For example, an electron probe microanalyzer (EPMA) can be used for measurement.

It is desired that, in the piezoelectric ceramics of the present invention, the proportion of the second crystal grain in the case of observing the surface or the cross section satisfy 0.5% by area or more and 5% by area or less.

When the proportion is less than 0.5% by area, the second crystal grain cannot sufficiently fill the pore, and hence the mechanical strength cannot be sufficiently enhanced. When the compositions satisfy the above-mentioned ranges, the first crystal grain is superior in piezoelectric property to the second crystal grain. When the proportion is more than 5% by area, the first crystal grain with excellent piezoelectricity is reduced too much, and hence the piezoelectric ceramics does not exert a sufficient piezoelectric property.

In the piezoelectric ceramics of the present invention, it is desired that the average equivalent circle diameter of the first crystal grain be larger than the average equivalent circle diameter of the second crystal grain. The pore is often formed at a gap between the crystal grains (grain boundary and triple junction). As a matter of course, the pore is often smaller than the crystal grain around the pore. Therefore, in order to fill such a pore, the second crystal grain needs to be a small crystal grain.

In the piezoelectric ceramics of the present invention, it is desired that the average equivalent circle diameter of the second crystal grain be 200 nm or more and 2 µm or less. When the average equivalent circle diameter is smaller than 200 nm, the second crystal grain cannot sufficiently fill the pore, and hence the mechanical strength is not enhanced. When the average equivalent circle diameter is larger than 2 µm, the second crystal grain becomes larger than an average pore, which is not preferred because strain may be generated at the peripheral portion.

In the piezoelectric ceramics of the present invention, it is desired that the first crystal grain contains Mn in an amount of 0.05% by weight or more and 0.40% by weight or less.

When the first crystal grain contains Mn within the above-mentioned range, the insulation property is enhanced. Further, deterioration due to depolarization is also prevented. When the content of Mn is less than 0.05% by weight, the effect to be obtained through manganese doping becomes small, and when the content exceeds 0.40% by weight, hexagonal barium titanate having a deteriorated piezoelectricity coexists, and hence the piezoelectricity of the entire piezoelectric ceramics may become insufficient.

Mn is preferred to occupy the B site. In a case where Mn is dissolved in the B site, a preferred range of A/B is $0.993 \leq A/B \leq 0.998$, where A/B is a ratio between the molar quantity of Ba and Ca in the A site and the molar quantity of Ti, Zr, and Mn in the B site. A piezoelectric ceramics having A/B in this range is particularly excellent in piezoelectric constant and mechanical quality factor, and hence a device excellent in durability can be manufactured through the use of the piezoelectric ceramics of the present invention.

Further, the valence of Mn is preferred to be 4+. The reason is as follows. In general, the valence of Mn may be 4+, 2+, or 3+. When a conduction electron exists in the crystal (for example, when an oxygen vacancy exists in the crystal, or when a donor element occupies the A site), the valence of Mn may be reduced from 4+ to 3+ or 2+ to trap the conduction electron. Thus, it is possible to increase the insulation resistance. The valence of Mn is preferred to be 4+ in view of the ion radius as well because Ti as the main component of the B site can be easily substituted.

On the other hand, when the valence of Mn is lower than 4+, for example, 2+, Mn becomes an acceptor. When Mn exists in the perovskite structure crystal as an acceptor, a hole is generated in the crystal, or an oxygen vacancy is formed in the crystal.

When a large number of doped Mn have a valence of 2+ or 3+, the holes cannot be sufficiently compensated for only by oxygen vacancy introduction, and thus the insulation resistance is reduced. Therefore, most Mn is preferred to have a valence of 4+. Note that, a small number of Mn may have a valence lower than 4+ so that the Mn occupies the B site of the perovskite structure as an acceptor to form the oxygen vacancy. This is because Mn having the valence of 2+ or 3+ and the oxygen vacancy form defect dipoles, and thus the mechanical quality factor of the piezoelectric material can be enhanced.

A manufacturing method for the piezoelectric ceramics of the present invention is not particularly limited.

When manufacturing the piezoelectric ceramics of the present invention, it is possible to adopt a general method of sintering solid powder of an oxide, a carbonate, a nitrate, an oxalate, and the like containing a constituent element at a normal pressure. Raw materials for the piezoelectric ceramics of the present invention are, for example, metal compounds such as a Ba compound, a Ca compound, a Ti compound, a Zr compound, and a Mn compound.

Examples of the Ba compound which may be used include barium oxide, barium carbonate, barium oxalate, barium acetate, barium nitrate, barium titanate, barium zirconate, and barium titanate zirconate.

Examples of the Ca compound which may be used include calcium oxide, calcium carbonate, calcium oxalate, calcium acetate, calcium titanate, and calcium zirconate.

Examples of the Ti compound which may be used include titanium oxide, barium titanate, barium titanate zirconate, and calcium titanate.

Examples of the Zr compound which may be used include zirconium oxide, barium zirconate, barium titanate zirconate, and calcium zirconate.

Examples of the Mn compound which may be used include manganese carbonate, manganese oxide, manganese dioxide, manganese trioxide, trimanganese tetraoxide, and manganese acetate.

For example, barium titanate raw material particles, calcium titanate raw material particles, and calcium zirconate raw material particles are subjected to sintering to obtain the piezoelectric ceramics of the present invention.

The raw material particles may contain a property adjuster other than manganese or an impurity component incorporated during synthesis. Examples of the impurity component include a component derived from a metal such as aluminum, niobium, iron, and lead, a glass component, and a hydrocarbon-based organic component. The content of the impurity component is preferably 5% by mass or less, more preferable 1% by mass or less.

There is no particular limit to the particle diameter of the raw material particle as a primary particle.

Note that, in order to form the second crystal grain that can efficiently fill the pore, it is desired that the raw material particle containing the Zr component be smaller than the raw material particle containing the Ca component. In this case, the primary particle refers to the minimum individual unit of the particles forming the powder, which can definitely be separated from others. For example, when the barium titanate raw material particle, the calcium titanate raw material particle, and the calcium zirconate raw material particle are used, it is desired that the average particle diameter of the primary particle of the calcium zirconate raw material particle be smaller than the average particle diameter of the primary particle of the calcium titanate raw material particle.

The recommended average particle diameter of the primary particle of the barium titanate raw material particle is 70 nm or more and 200 nm or less. Further, the recommended average particle diameter of the primary particle of the calcium titanate raw material particle is 90 nm or more and 350 nm or less. Further, the recommended average particle diameter of the primary particle of the calcium zirconate raw material particle is 20 nm or more and 150 nm or less.

In calcium zirconate, the average particle diameter of the primary particle of the raw material particle is small, and hence the sintering reaction progresses in advance of others, and the Ca component and the Zr component incorporated in the raw material particle are dissolved. In this case, the solubility limits of the Zr component and the Ca component with respect to barium titanate are affected by their dissolved amounts. That is, when the dissolved amount of the Zr component increases, the solubility limit of the Ca component tends to decrease.

On the other hand, in calcium titanate, the average particle diameter of the primary particle of the raw material particle is large, and hence the sintering reaction is less liable to progress. The Zr component is dissolved and the solubility limit of the Ca component is decreased, and hence a second crystal grain containing a large amount of calcium titanate which has not been dissolved is liable to be formed.

There is no particular limit to a method of producing particles to be used as raw materials of the present invention.

The raw material particle can be obtained by a manufacturing method such as a sol-gel method, a solid-phase method, a coprecipitation method, a hydrothermal synthesis method, an alkoxide method, and an oxalate method. Alternatively, the raw material particle may be manufactured through the use of, for example, barium titanate, barium zirconate, calcium titanate, or calcium zirconate commercially available for industrial use.

There is no particular limit to a method of granulating raw material powder of the piezoelectric ceramics of the present invention.

The method may involve granulating mixed powder obtained by mechanically mixing a Ba compound, a Ca compound, a Ti compound, a Zr compound, and a Mn compound. Alternatively, the method may involve calcining these compounds at about 800 to 1,300° C., followed by granulation. Alternatively, the method may involve calcining a Ba compound, a Ca compound, a Ti compound, and a Zr compound and adding a manganese compound to these compounds together with a binder. From the viewpoint that a grain diameter of granulated powder can be made more uniform, a most preferred granulation method is a spray dry method.

Examples of the binder which may be used for granulation include polyvinyl alcohol (PVA), polyvinyl butyral (PVB), and an acrylic resin. The amount of the binder to be added is preferably 1% by mass to 10% by mass, more preferably 2% by mass to 5% by mass from the viewpoint of increasing the density of a compact.

There is no particular limit to a method of sintering the piezoelectric ceramics of the present invention. Examples of the sintering method include sintering using an electric furnace, a conduction heating method, a microwave sintering method, a millimeter-wave sintering method, and hot isostatic pressing (HIP).

Although there is no particular limit to a sintering temperature of the piezoelectric ceramics of the present invention, it is desired that the sintering be performed at a temperature T1 at which the crystal sufficiently grows and the Ca component sufficiently dissolves, and then the sintering be performed at a temperature T2 at which precipitation is promoted. The sintering temperature T1 is preferably 1,200° C. or more and 1,340° C. or less, and the sintering temperature T2 is preferably 1,000° C. or more and (T1−100° C.) or less.

When the sintering temperature T1 exceeds 1,340° C. and liquid phase sintering starts, crystal grain coarsening occurs, which is not preferred.

In order to stabilize the property of the piezoelectric material obtained by sintering with good reproducibility, and further, in order to sufficiently generate a precipitate, the piezoelectric material may be sintered for 1 hour or more and 12 hours or less with the sintering temperature set constant in the above-mentioned range.

By keeping the temperature to T1, the crystal grain sufficiently grows, and further, a sufficient amount of Ca component dissolves in the crystal grain. After that, by decreasing the temperature and keeping the temperature to T2, the solubility limit of the Ca component decreases, and the surplus Ca component is precipitated to generate the second crystal grain.

In the following, a piezoelectric element using the piezoelectric ceramics of the present invention is described.

FIG. 1 is a schematic diagram illustrating a configuration of a piezoelectric element according to an embodiment of the present invention. The piezoelectric element according to the present invention is a piezoelectric element including at least a first electrode 1, a piezoelectric ceramics 2, and a second electrode 3, and the piezoelectric ceramic 2 is the piezoelectric ceramics of the present invention. The piezoelectric property of the piezoelectric ceramics of the present invention can be evaluated by forming the piezoelectric element including at least the first electrode and the second electrode. The first electrode and the second electrode are each formed of a conductive layer having a thickness of about 5 nm to 2,000 nm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu, and compounds thereof.

Each of the first electrode and the second electrode may be formed of one kind of those materials, or may be obtained by stacking two or more kinds thereof. The first electrode and the second electrode may be formed of different materials, respectively.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

It is more preferred that the piezoelectric element have spontaneous polarization axes aligned in a certain direction. When the spontaneous polarization axes are aligned in a certain direction, the piezoelectric constant of the piezoelectric element increases.

A polarization method for the piezoelectric element is not particularly limited. The polarization treatment may be performed in the air or may be performed in a silicone oil. A temperature at which the polarization is performed is preferably a temperature of 60° C. to 150° C. However, an optimum condition slightly varies depending on the composition of a piezoelectric material constituting the element. An electric field to be applied for performing the polarization treatment is preferably from 800 V/mm to 2.0 kV/mm.

The piezoelectric constant and mechanical quality factor of the piezoelectric element may be determined by calculation, from the measurement results of a resonance frequency and an antiresonance frequency, which are obtained using a commercially available impedance analyzer, based on the standard of Japan Electronics and Information Technology Industries Association (JEITA EM-4501). This method is hereinafter referred to as resonance-antiresonance method.

Next, a multilayered piezoelectric element of the present invention is described.

The multilayered piezoelectric element according to the present invention is a multilayered piezoelectric element including piezoelectric ceramic layers and electrodes including an internal electrode stacked alternately, in which the piezoelectric ceramic layers are formed of the piezoelectric ceramics of the present invention.

Figure 2A:
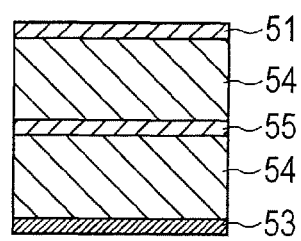
FIGS. 2A and 2B are schematic sectional diagrams illustrating a configuration of a multilayered piezoelectric element according to an embodiment of the present invention.
Figure 2B:
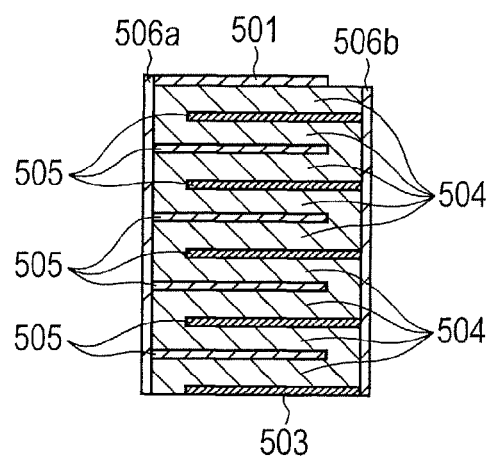

FIGS. 2A and 2B are each a schematic sectional diagram illustrating a configuration of a multilayered piezoelectric element according to an embodiment of the present invention. The multilayered piezoelectric element according to the present invention is a multilayered piezoelectric element including piezoelectric ceramic layers 54 and electrodes including an internal electrode 55, the piezoelectric ceramic layers and the electrodes being stacked alternately, in which the piezoelectric ceramic layers 54 are formed of the above-mentioned piezoelectric ceramics. The electrode layers may include external electrodes such as a first electrode 51 and a second electrode 53 in addition to the internal electrode 55.

FIG. 2A illustrates the configuration of the multilayered piezoelectric element of the present invention in which the piezoelectric ceramic layers 54 of two layers and the internal electrode 55 of one layer are stacked alternately, and the multilayered structure is sandwiched between the first electrode 51 and the second electrode 53. However, as illustrated in FIG. 2B, the number of piezoelectric ceramic layers and internal electrodes may be increased, and the number of the layers is not limited. The multilayered piezoelectric element of FIG. 2B has such a configuration that piezoelectric ceramic layers 504 of nine layers and internal electrodes 505 of eight layers are stacked alternately, and the multilayered structure is sandwiched between a first electrode 501 and a second electrode 503, and has an external electrode 506a and an external electrode 506b for short-circuiting the alternately formed internal electrodes.

The internal electrodes 55, 505 and the external electrodes 506a, 506b do not need to be identical in size and shape to the piezoelectric ceramic layer 504, and may be divided into multiple portions.

The internal electrodes 55, 505 and the external electrodes 506a, 506b are formed of a conductive layer having a thickness of about 5 nm to 2,000 nm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu and compounds thereof. The internal electrodes 55, 505 and the external electrodes 506a, 506b may be formed of one kind thereof, may be formed of a mixture or alloy of two or more kinds thereof, or may be formed of a multilayered body of two or more kinds thereof. Further, multiple electrodes may be respectively formed of materials different from each other.

The internal electrodes 55, 505 each contain Ag and Pd, and a weight ratio M1/M2 between the content weight M1 of Ag and the content weight M2 of Pd is preferably $0.25 \leq M1/M2 \leq 4.0$. A case where the weight ratio M1/M2 is less than 0.25 is not desired because the sintering temperature of the internal electrode increases. On the other hand, a case where the weight ratio M1/M2 is more than 4.0 is not desired because the internal electrode becomes island-shaped, resulting in in-plane non-uniformity. The weight ratio M1/M2 is more preferably $0.3 \leq M1/M2 \leq 3.0$.

From the viewpoint that an electrode material is inexpensive, it is preferred that the internal electrodes 55, 505 contain at least any one kind of Ni and Cu. When at least any one kind of Ni and Cu is used for the internal electrodes 55, 505, the multilayered piezoelectric element of the present invention is preferably calcinated in a reducing atmosphere.

As illustrated in FIG. 2B, multiple electrodes including the internal electrodes 505 may be short-circuited to each other for the purpose of making the phase of a driving voltage uniform. For example, there is a given such a configuration that the internal electrodes 505, the first electrode 501, and the second electrode 503 are short-circuited alternately. Further, a mode in which the electrodes are short-circuited to each other is not limited. An electrode or wiring for short-circuit may be provided on a side surface of the multilayered piezoelectric element. Alternatively, the electrodes may be short-circuited to each other by providing a through-hole passing through the piezoelectric ceramic layers 504 and providing a conductive material inside the through hole.

In the following, a liquid ejection head which uses the piezoelectric element of the present invention is described.

The liquid ejection head according to the present invention includes at least a liquid chamber including a vibration portion including the piezoelectric element or the multilayered piezoelectric element, and an ejection orifice communicating to the liquid chamber.

Figure 3A:
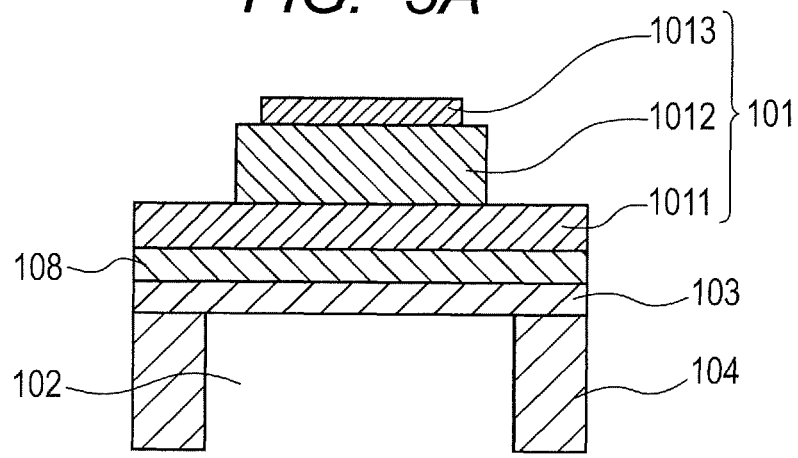
FIGS. 3A and 3B are schematic diagrams illustrating a configuration of a liquid ejection head according to an embodiment of the present invention.
Figure 3B:
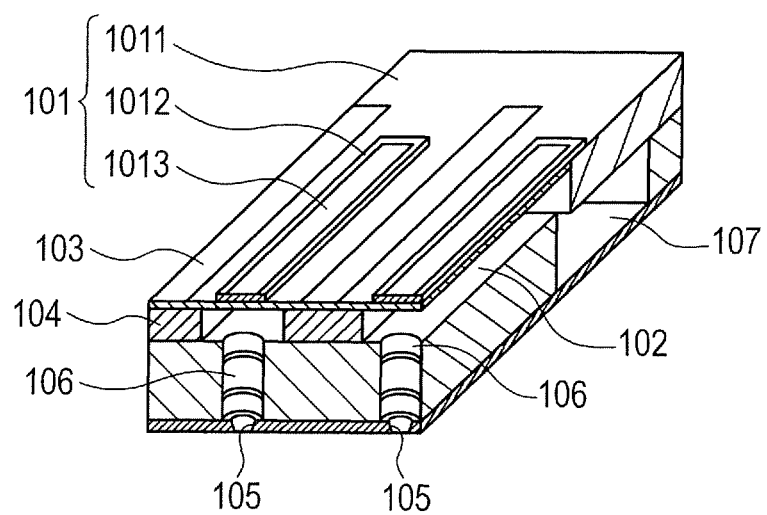

FIGS. 3A and 3B are schematic diagrams illustrating a configuration of a liquid ejection head according to an embodiment of the present invention. As illustrated in FIGS. 3A and 3B, the liquid ejection head of the present invention is a liquid ejection head including a piezoelectric element 101 of the present invention. The piezoelectric element 101 is a piezoelectric element including at least a first electrode 1011, a piezoelectric ceramics 1012, and a second electrode 1013. The piezoelectric ceramics 1012 is patterned as required as illustrated in FIG. 3B.

FIG. 3B is a schematic diagram of the liquid ejection head. The liquid ejection head includes ejection orifices 105, individual liquid chambers 102, communicating holes 106 for connecting the individual liquid chambers 102 and the ejection orifices 105, liquid chamber partition walls 104, a common liquid chamber 107, a diaphragm 103, and the piezoelectric elements 101. Each of the piezoelectric elements 101, which is of a rectangular shape in FIG. 3B, may be of a shape besides the rectangular shape such as an elliptical shape, a circular shape, or a parallelogram shape. In general, the piezoelectric ceramics 1012 are each of a shape in conformity with the shape of the individual liquid chamber 102.

The vicinity of the piezoelectric element 101 included in the liquid ejection head of the present invention is described in detail with reference to FIG. 3A. FIG. 3A is a sectional diagram of the piezoelectric element illustrated in FIG. 3B in the width direction thereof. The sectional shape of the piezoelectric element 101, which is illustrated in a rectangular shape, may be a trapezoidal shape or a reverse trapezoidal shape.

In FIG. 3A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode. Note that, those differences in name are caused by a manufacturing method for the device and an advantageous effect of the present invention can be obtained in any case.

In the liquid ejection head, the diaphragm 103 vertically fluctuates owing to the expansion and contraction of the piezoelectric ceramics 1012 to apply a pressure to liquid in the individual liquid chamber 102. As a result, the liquid is ejected from the ejection orifice 105. The liquid ejection head of the present invention can be used in a printer application or the manufacture of an electronic equipment.

The diaphragm 103 has a thickness of 1.0 µm or more to 15 µm or less, preferably 1.5 µm or more to 8 µm or less. A material for the diaphragm, which is not limited, is preferably Si. Si for the diaphragm may be doped with boron or phosphorus. In addition, the buffer layer and the electrode layer on the diaphragm may serve as part of the diaphragm. The buffer layer 108 has a thickness of 5 nm or more to 300 nm or less, preferably 10 nm or more to 200 nm or less. The size of the ejection orifice 105 is 5 µm or more to 40 µm or less in terms of an equivalent circle diameter. The shape of the ejection orifice 105 may be a circular shape, or may be a star shape, a square shape, or a triangular shape.

Next, a liquid ejection apparatus of the present invention is described. The liquid ejection apparatus of the present invention includes a conveying unit for a recording medium and the liquid ejection head.

Figure 4:
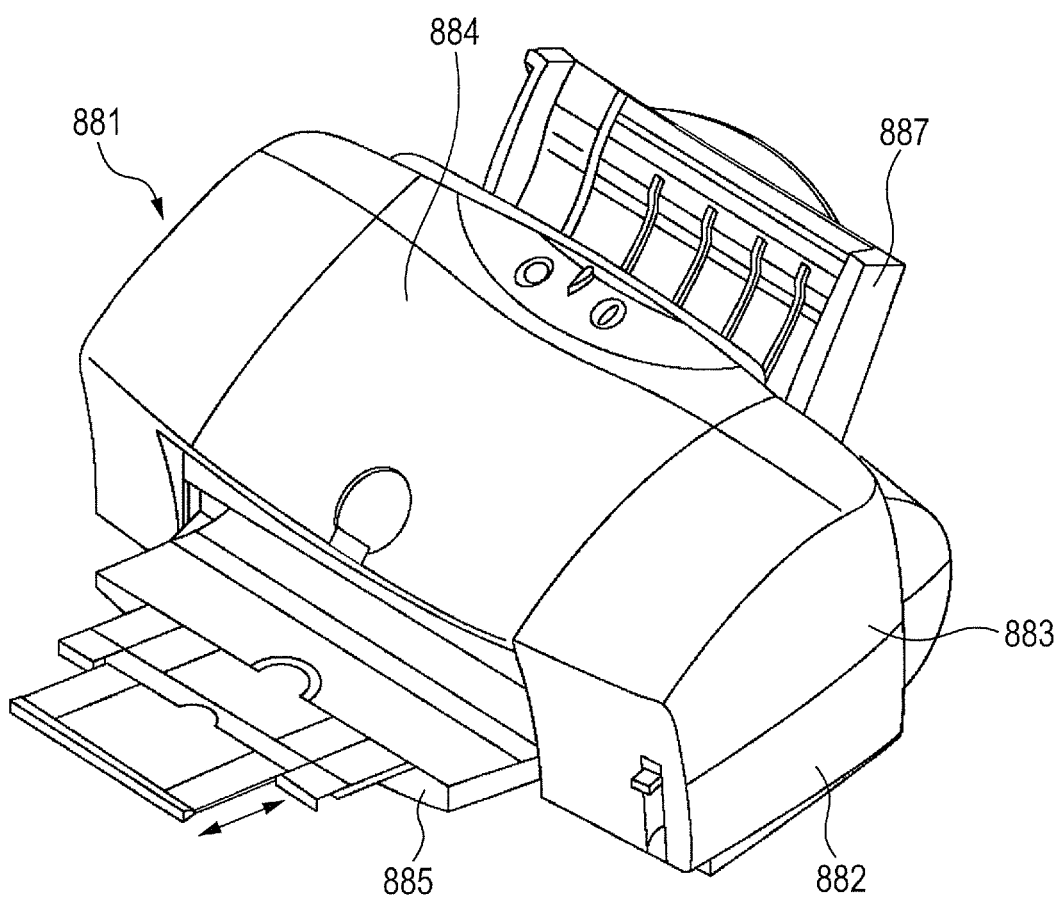
FIG. 4 is a schematic diagram illustrating a liquid ejection apparatus according to an embodiment of the present invention.
Figure 5:
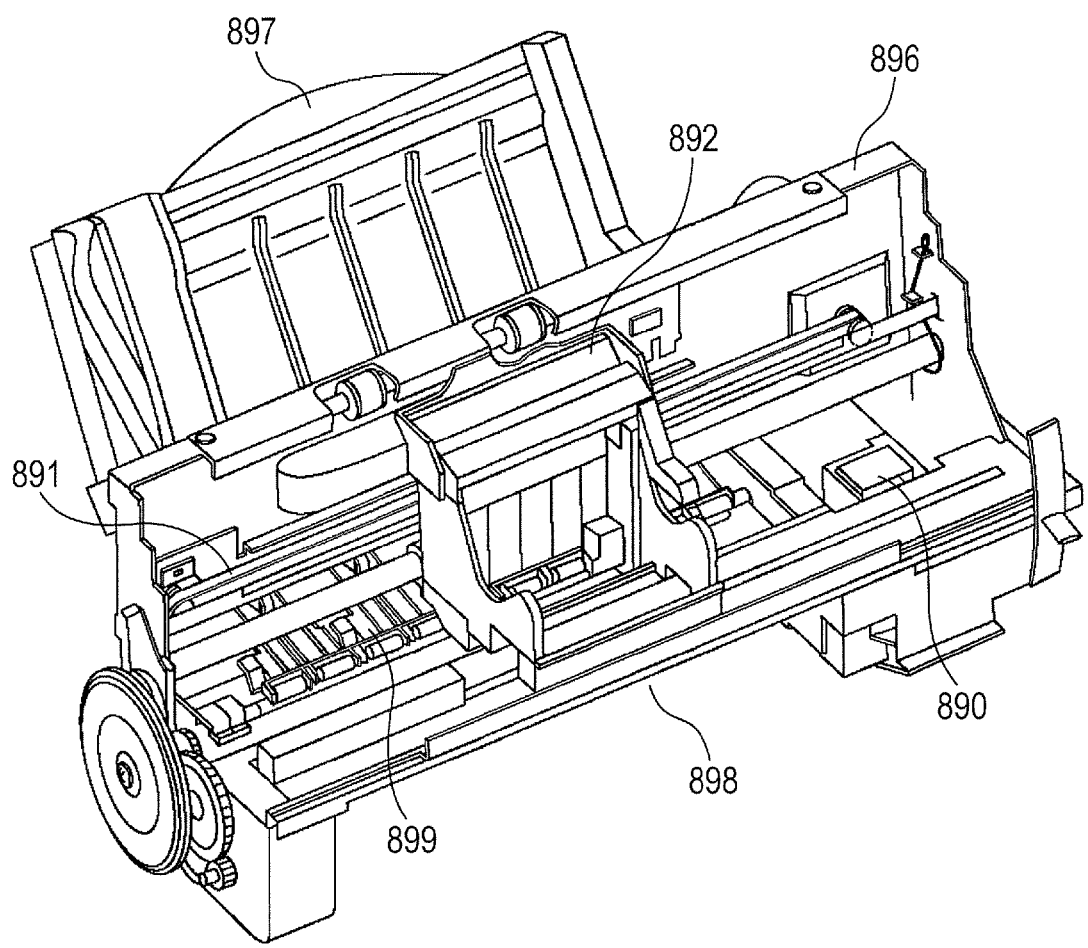
FIG. 5 is a schematic diagram illustrating the liquid ejection apparatus according to the embodiment of the present invention.

As an example of the liquid ejection apparatus of the present invention, there is an ink jet recording apparatus illustrated in FIGS. 4 and 5. FIG. 5 illustrates a liquid ejection apparatus (ink jet recording apparatus) 881 illustrated in FIG. 4 in a state in which sheathings 882 to 885 and 887 thereof are removed. The ink jet recording apparatus 881 includes an automatic feeding unit 897 for automatically feeding recording sheets as recording media into a device main body 896. Further, the ink jet recording apparatus 881 includes a conveying unit 899 for guiding the recording sheet fed from the automatic feeding unit 897 to a predetermined recording position and from the recording position to an ejection orifice 898, a recording unit 891 for performing recording on the recording sheet conveyed to the recording position, and a recovery unit 890 for performing a recovery process on the recording unit 891. The recording unit 891 includes a carriage 892 which contains the liquid ejection head of the present invention and is reciprocated on a rail.

In this ink jet recording apparatus, the carriage 892 is moved on the rail based on an electric signal sent from a computer, and a drive voltage is applied to electrodes sandwiching a piezoelectric ceramics so that the piezoelectric ceramics is displaced. This displacement of the piezoelectric ceramics pressurizes each individual liquid chamber 102 via the diaphragm 103 illustrated in FIG. 3B, and hence ink is ejected from the ejection orifice 105 so as to perform printing.

The liquid ejection apparatus of the present invention can eject liquid uniformly at high speed, and the device can be downsized.

In the example described above, the printer is exemplified. However, the liquid ejection apparatus of the present invention can be used as an industrial liquid ejection apparatus in addition to an ink jet recording apparatus including a facsimile, a multifunction peripheral, a copying machine, and the like.

Next, an ultrasonic motor using the piezoelectric element of the present invention is described. The ultrasonic motor of the present invention includes at least a vibration body including the piezoelectric element or the multilayered piezoelectric element, and a moving body to be brought into contact with the vibration body.

Figure 6A:
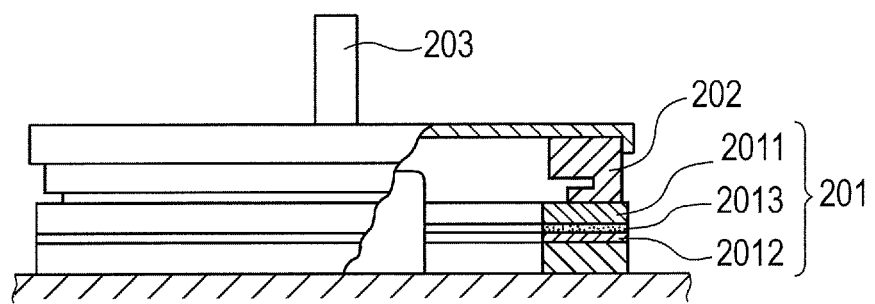
FIGS. 6A and 6B are schematic diagrams illustrating a configuration of an ultrasonic motor according to an embodiment of the present invention.
Figure 6B:
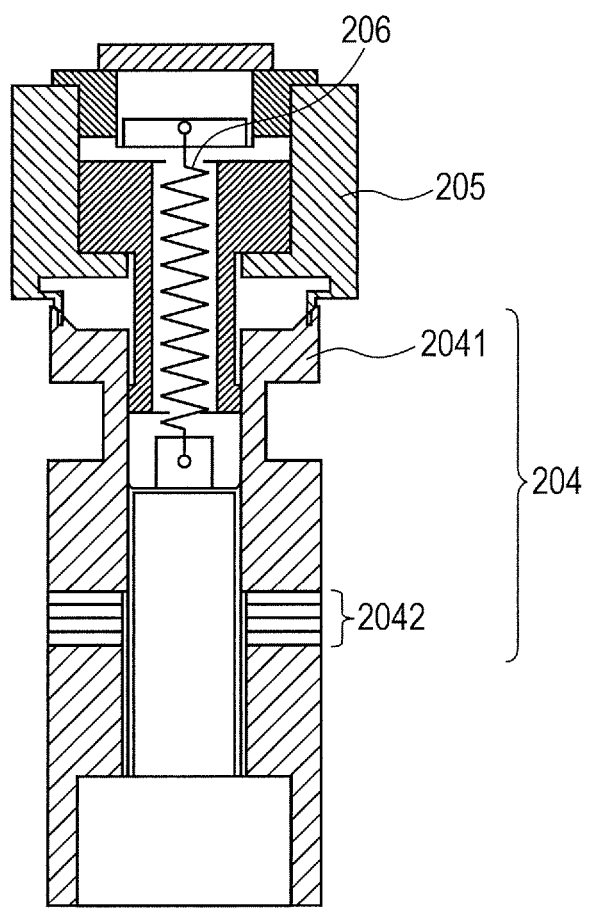

FIGS. 6A and 6B are schematic diagrams illustrating a configuration of an ultrasonic motor according to an embodiment of the present invention. FIG. 6A illustrates the ultrasonic motor in which the piezoelectric element of the present invention is formed of a single plate. The ultrasonic motor includes an oscillator 201, a rotor 202 brought into contact with the sliding surface of the oscillator 201 with a pressure applied from a pressurizing spring (not shown), and an output shaft 203 provided so as to be integral with the rotor 202. The oscillator 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric ceramics sandwiched between a first electrode (not shown) and a second electrode (not shown).

The application of two alternating voltages different from each other in phase by an odd multiple of $\pi/4$ to the piezoelectric element of the present invention results in the generation of a flexural traveling wave in the oscillator 201, and hence each point on the sliding surface of the oscillator 201 undergoes an elliptical motion. When the rotor 202 is brought into press contact with the sliding surface of the oscillator 201, the rotor 202 receives a frictional force from the oscillator 201 to rotate in the direction opposite to the flexural traveling wave. A body to be driven (not shown) is joined to the output shaft 203, and is driven by the rotary force of the rotor 202.

The application of a voltage to the piezoelectric ceramics results in the expansion and contraction of the piezoelectric ceramics due to a transverse piezoelectric effect. When an elastic body such as a metal is joined to the piezoelectric element, the elastic body is bent by the expansion and contraction of the piezoelectric ceramics. The ultrasonic motor of the kind described here utilizes this principle.

Next, an ultrasonic motor including a piezoelectric element having a multilayered structure is illustrated in FIG. 6B. An oscillator 204 is formed of a multilayered piezoelectric element 2042 sandwiched between tubular metal elastic bodies 2041. The multilayered piezoelectric element 2042 is an element formed of multiple stacked piezoelectric materials (not shown), and includes a first electrode and a second electrode on its outer surfaces of the stack, and internal electrodes on its inner surface of the stack. The metal elastic bodies 2041 are fastened with bolts so that the multilayered piezoelectric element 2042 may be sandwiched between and fixed by the bodies. Thus, the oscillator 204 is formed.

The application of alternating voltages different from each other in phase to the multilayered piezoelectric element 2042 causes the oscillator 204 to excite two vibrations orthogonal to each other. The two vibrations are synthesized to form a circular vibration for driving the tip portion of the oscillator 204. Note that, a constricted annular groove is formed in the upper portion of the oscillator 204 to enlarge the displacement of the vibration for driving.

A rotor 205 is brought into contact with the oscillator 204 under a pressure from a spring 206 for pressurization to obtain a frictional force for driving. The rotor 205 is rotatably supported by a bearing.

Next, an optical equipment of the present invention is described. The optical equipment of the present invention includes a drive unit including the ultrasonic motor.

Figure 7A:
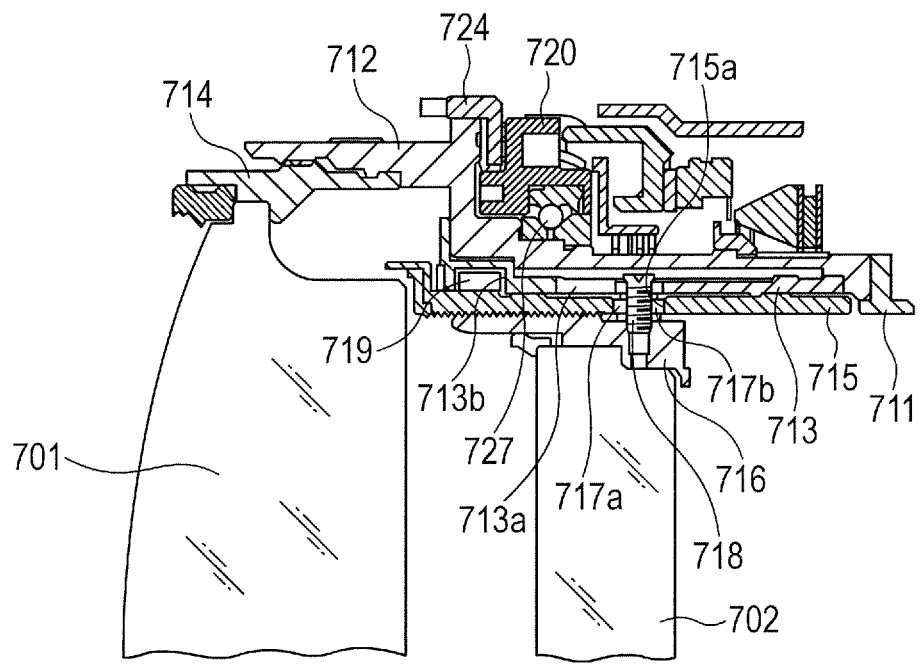
FIGS. 7A and 7B are schematic diagrams illustrating an optical equipment according to an embodiment of the present invention.
Figure 7B:
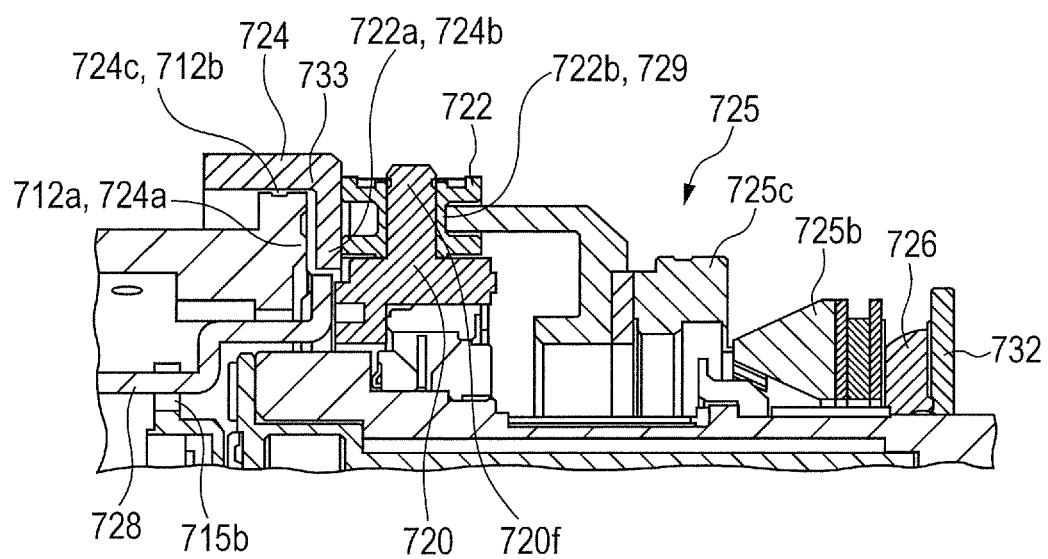
Figure 8:
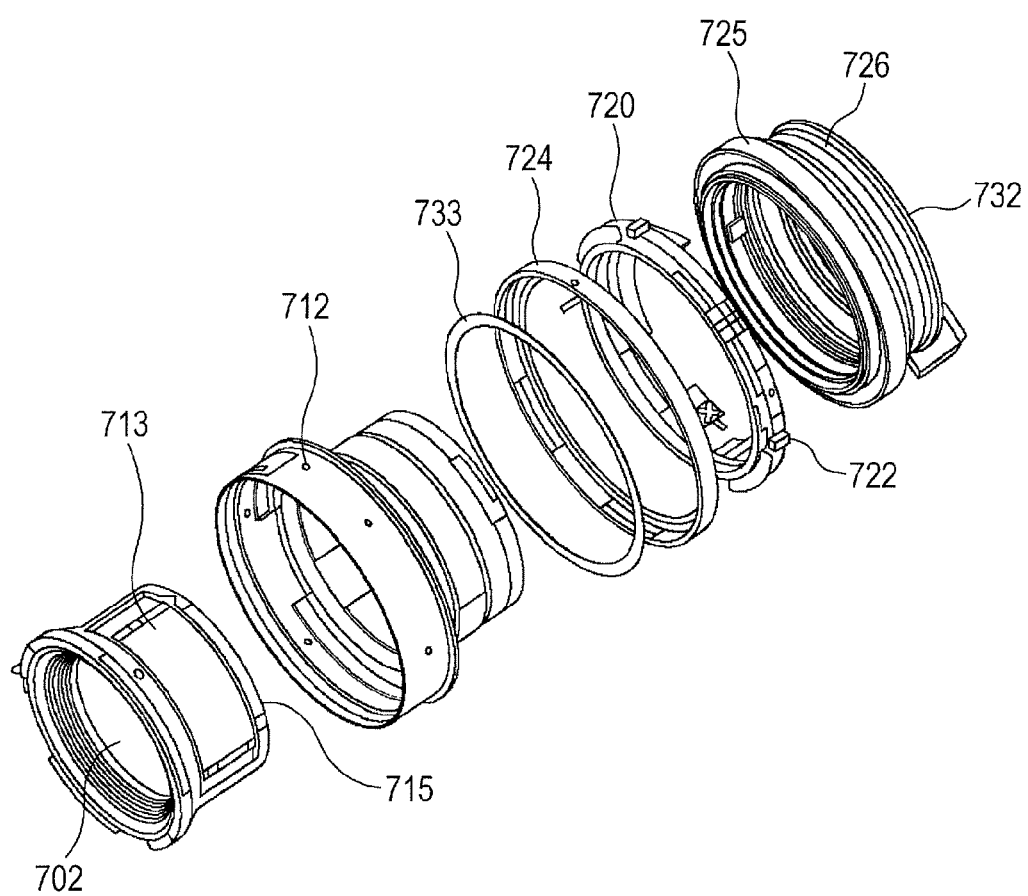
FIG. 8 is a schematic diagram illustrating the optical equipment according to the embodiment of the present invention.

FIGS. 7A and 7B are sectional diagrams of main parts of an interchangeable lens barrel for a single-lens reflex camera as an example of an imaging apparatus according to an exemplary embodiment of the present invention. In addition, FIG. 8 is an exploded perspective diagram of the interchangeable lens barrel for the single-lens reflex camera as the example of the imaging apparatus according to the exemplary embodiment of the present invention. A fixed barrel 712, a linear guide barrel 713, and a front unit barrel 714 are fixed to an attachable/detachable mount 711 for a camera. These are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear unit barrel 716 supporting the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is disposed a rotation transmission ring 720 supported by a ball race 727 in a rotatable manner at a constant position with respect to the fixed barrel 712. The rotation transmission ring 720 has shafts 720f extending radially from the rotation transmission ring 720, and rollers 722 are supported by the shafts 720f in a rotatable manner. A large diameter part 722a of the roller 722 contacts with a mount side end surface 724b of a manual focus ring 724. In addition, a small diameter part 722b of the roller 722 contacts with a joining member 729. Six rollers 722 are disposed on the outer periphery of the rotation transmission ring 720 at uniform intervals, and each roller is provided in the relationship as described above.

A low friction sheet (washer member) 733 is disposed on an inner diameter part of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

Note that, the large diameter part 722a of the roller 722 contacts with the mount side end surface 724a of the manual focus ring in a state in which a pressure is applied by a pressing force of a wave washer 726 pressing an ultrasonic motor 725 to the front of the lens. In addition, similarly, the small diameter part 722b of the roller 722 contacts with the joining member 729 in a state in which an appropriate pressure is applied by a pressing force of the wave washer 726 pressing the ultrasonic motor 725 to the front of the lens. Movement of the wave washer 726 in the mount direction is restricted by a washer 732 connected to the fixed barrel 712 by bayonet joint. A spring force (biasing force) generated by the wave washer 726 is transmitted to the ultrasonic motor 725, and further to the roller 722, to be a force for the manual focus ring 724 to press the mount side end surface 712a of the fixed barrel 712. In other words, the manual focus ring 724 is integrated in a state in which the manual focus ring 724 is pressed to the mount side end surface 712a of the fixed barrel 712 via the low friction sheet 733.

Therefore, when a control unit (not shown) drives the ultrasonic motor 725 to rotate with respect to the fixed barrel 712, the rollers 722 rotate about the shafts 720f because the joining member 729 is brought into contact by friction to the small diameter parts 722b of the rollers 722. As a result of the rotation of the rollers 722 about the shafts 720f, the rotation transmission ring 720 rotates about the optical axis (automatic focus operation).

In addition, when a manual operation input portion (not shown) gives a rotation force about the optical axis to the manual focus ring 724, the rollers 722 rotate about the shafts 720f by friction force because the mount side end surface 724b of the manual focus ring 724 is brought into contact by pressure to the large diameter parts 722a of the rollers 722. When the large diameter parts 722a of the rollers 722 rotate about the shafts 720f, the rotation transmission ring 720 rotates about the optical axis. In this case, the ultrasonic motor 725 does not rotate because of a friction retaining force between a rotor 725c and a stator 725b (manual focus operation).

Two focus keys 728 are mounted to the rotation transmission ring 720 at opposing positions, and the focus key 728 is fitted to a notch portion 715b disposed on the tip of the cam ring 715. Therefore, when the automatic focus operation or the manual focus operation is performed so that the rotation transmission ring 720 is rotated about the optical axis, the rotation force is transmitted to the cam ring 715 via the focus key 728. When the cam ring is rotated about the optical axis, the rear unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed.

In this case, the interchangeable lens barrel for the single-lens reflex camera is described above as the optical equipment of the present invention, but the present invention can be applied to any optical equipment including the ultrasonic motor in the drive unit, regardless of a type of the camera, including a compact camera, an electronic still camera, and the like.

A vibration device used for conveying or removing particles, powder, or liquid droplets is used widely for an electronic equipment or the like. In the following, as an example of the vibration device of the present invention, a dust removing device using the piezoelectric element of the present invention is described.

The dust removing device according to the present invention includes at least a vibration body including the piezoelectric element or the multilayered piezoelectric element.

Figure 9A:
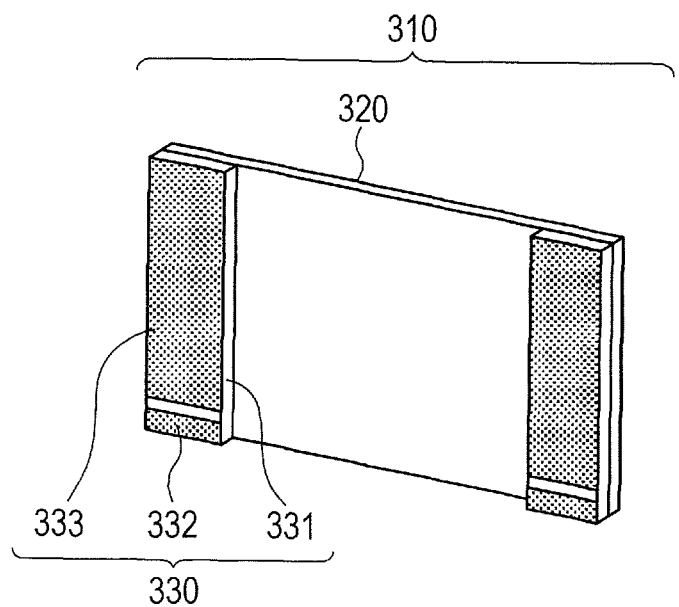
FIGS. 9A and 9B are schematic diagrams illustrating a case where a vibration device is used as a dust removing device according to an embodiment of the present invention.
Figure 9B:
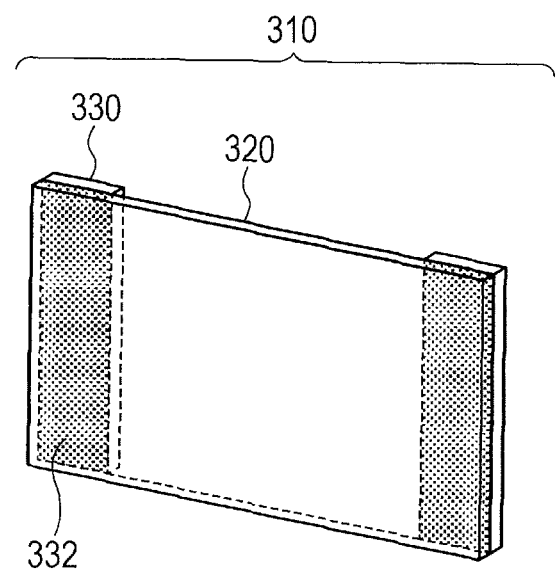

FIGS. 9A and 9B are schematic diagrams illustrating a dust removing device according to an embodiment of the present invention. A dust removing device 310 is formed of a plate-like piezoelectric element 330 and a diaphragm 320. The piezoelectric element 330 may be a multilayered piezoelectric element of the present invention. The material of the diaphragm 320 is not limited. In the case where the dust removing device 310 is used for an optical equipment, a transparent material or a reflective material can be used as the material of the diaphragm 320.

FIGS. 10A to 10C are schematic diagrams illustrating a configuration of the piezoelectric element 330 illustrated in FIGS. 9A and 9B. FIGS. 10A and 10C illustrate a front surface configuration and a rear surface configuration of the piezoelectric element 330, respectively. FIG. 10B illustrates a side surface configuration. As illustrated in FIGS. 9A and 9B, the piezoelectric element 330 includes a piezoelectric ceramics 331, a first electrode 332, and a second electrode 333. The first electrode 332 and the second electrode 333 are disposed so as to be opposed to each other on the plate planes of the piezoelectric ceramics 331. Similarly to FIGS. 9A and 9B, the piezoelectric element 330 may be the multilayered piezoelectric element of the present invention. In this case, the piezoelectric ceramics 331 has an alternate structure of the piezoelectric material layer and the internal electrode. The internal electrode is alternately short-circuited to the first electrode 332 or the second electrode 333. Thus, drive waveforms having different phases can be applied to respective layers of the piezoelectric material. The front plane of the piezoelectric element 330 illustrated in FIG. 10C, on which the first electrode 332 is disposed, is referred to as a first electrode plane 336. The front plane of the piezoelectric element 330 illustrated in FIG. 10A, on which the second electrode 333 is disposed, is referred to as a second electrode plane 337.

In this case, the electrode plane in the present invention means a plane of the piezoelectric element on which the electrode is disposed. For example, as illustrated in FIGS. 10A to 10C, the first electrode 332 may extend around to the second electrode plane 337. As illustrated in FIGS. 9A and 9B, as for the piezoelectric element 330 and the diaphragm 320, the plate surface of the diaphragm 320 is fixed to the first electrode plane 336 of the piezoelectric element 330. When the piezoelectric element 330 is driven, a stress is generated between the piezoelectric element 330 and the diaphragm 320 so that out-of-plane oscillation is generated in the diaphragm. The dust removing device 310 of the present invention is a device that removes foreign matters such as dust sticking to the surface of the diaphragm 320 by the out-of-plane oscillation of the diaphragm 320. The out-of-plane oscillation means elastic oscillation in which the diaphragm is displaced in the optical axis direction, namely in the thickness direction of the diaphragm.

FIGS. 11A and 11B are schematic diagrams illustrating a vibration principle of the dust removing device 310 of the present invention. FIG. 11A illustrates a state in which alternating electric fields having the same phase are applied to a pair of left and right piezoelectric elements 330 so that the out-of-plane oscillation is generated in the diaphragm 320. The polarization direction of the piezoelectric ceramics forming the pair of left and right piezoelectric elements 330 is the same as the thickness direction of the piezoelectric elements 330, and the dust removing device 310 is driven by the seventh oscillation mode. FIG. 11B illustrates a state in which alternating voltages having reverse phases by 180 degrees are applied to the pair of left and right piezoelectric elements 330 so that the out-of-plane oscillation is generated in the diaphragm 320. The dust removing device 310 is driven by the sixth oscillation mode. The dust removing device 310 of the present invention is a device that can effectively remove dust sticking to the surface of the diaphragm by using at least two oscillation modes selectively.

Figure 12:
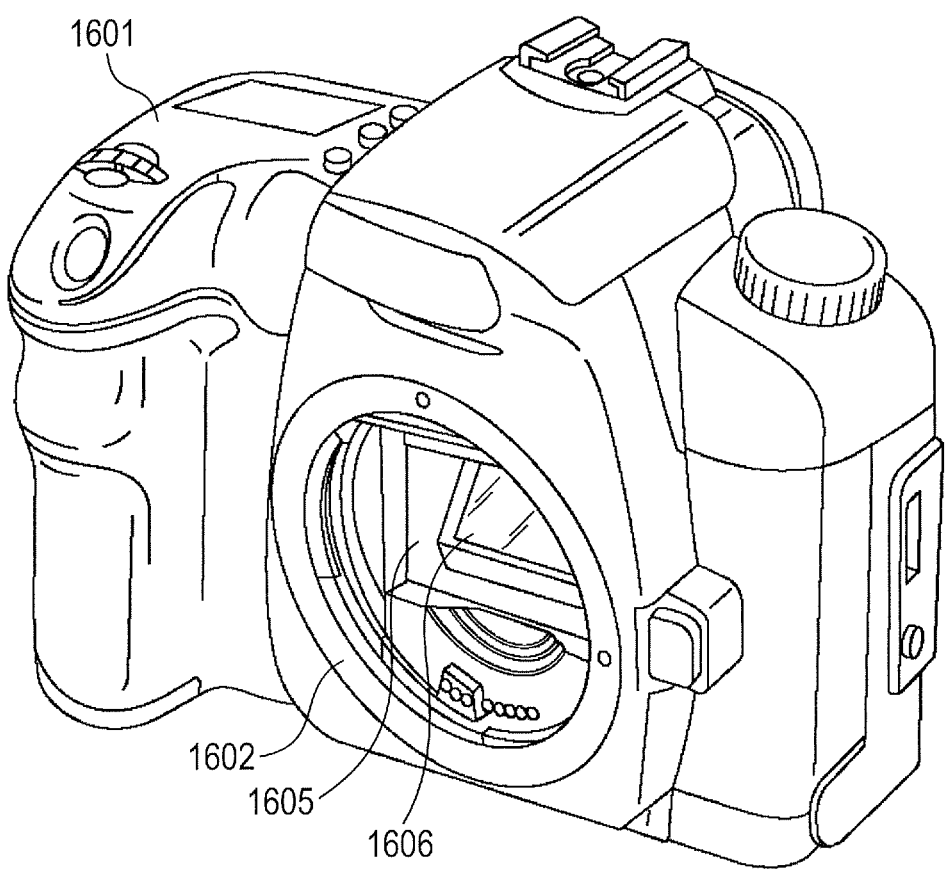
FIG. 12 is a schematic diagram illustrating an imaging apparatus according to an embodiment of the present invention.
Figure 13:
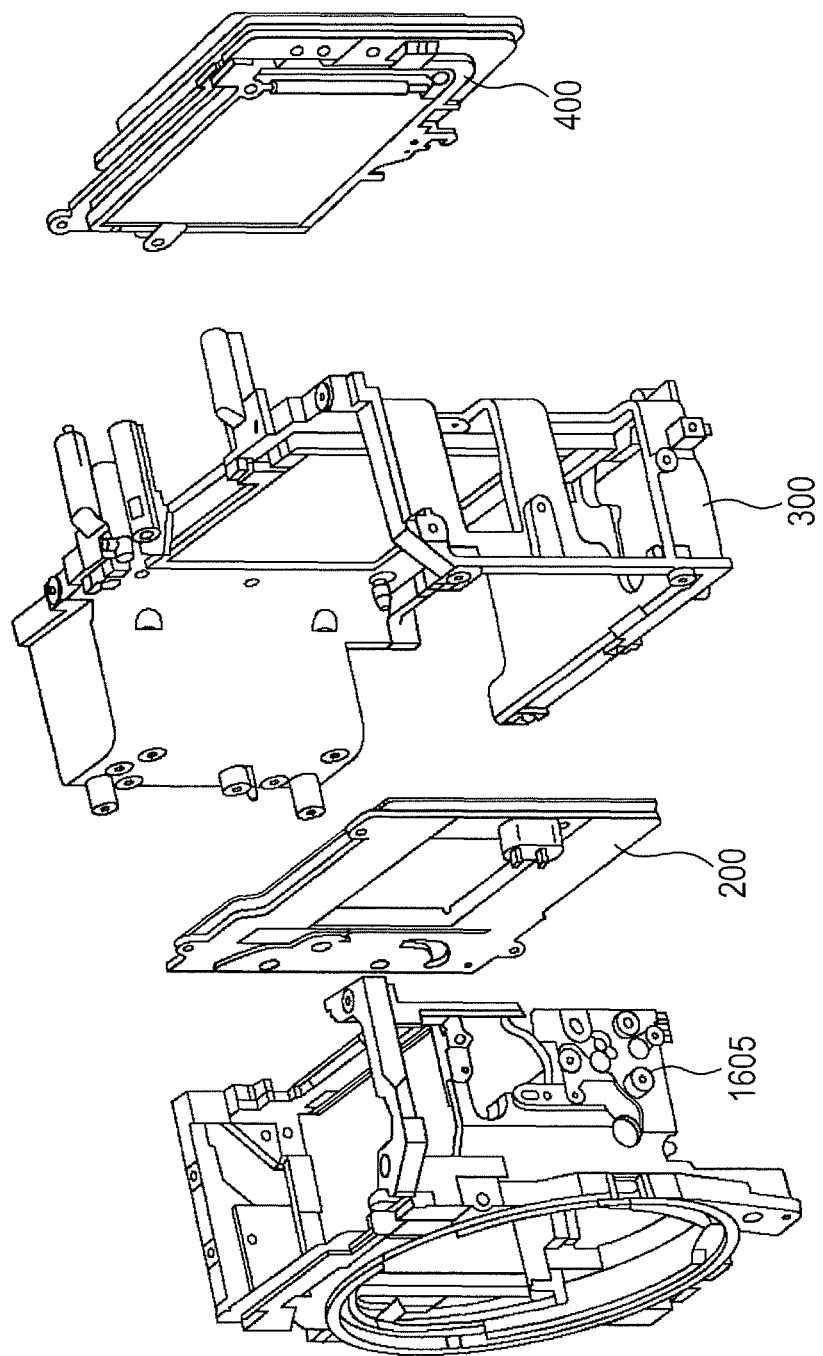
FIG. 13 is a schematic diagram illustrating the imaging apparatus according to the embodiment of the present invention.

Next, an imaging apparatus of the present invention is described. The imaging apparatus of the present invention is an imaging apparatus including at least the dust removing device and an imaging element unit. The vibration member of the dust removing device is disposed on a light receiving plane of the imaging element unit. FIGS. 12 and 13 are diagrams illustrating a digital single-lens reflex camera as an example of an imaging apparatus according to an exemplary embodiment of the present invention.

FIG. 12 is a front side perspective diagram of a camera main body 1601 viewed from an object side, in which an imaging lens unit is removed. FIG. 13 is an exploded perspective diagram illustrating an internal schematic configuration of the camera for describing a peripheral structure of the dust removing device and an imaging unit 400 of the present invention.

A mirror box 1605 for guiding an imaging light beam that has passed through the imaging lens is disposed in the camera main body 1601, and a main mirror (quick return mirror) 1606 is disposed in the mirror box 1605. The main mirror 1606 can take one of states including a state of being supported at an angle of 45 degrees with respect to an imaging optical axis in order to guide the imaging light beam in the direction to a penta dach mirror (not shown) and a state of being retreated from the imaging light beam in order to guide the imaging light beam in the direction to an imaging element (not shown).

On the object side of a main body chassis 300 to be a skeleton of the camera main body, the mirror box 1605 and a shutter unit 200 are disposed in order from the object side. In addition, on a photographer side of the main body chassis 300, the imaging unit 400 is disposed. The imaging unit 400 is adjusted and disposed so that the imaging surface of the imaging element is parallel to a mounting surface of a mount part 1602 to be a reference for mounting the imaging lens unit with a predetermined distance.

In this case, the digital single-lens reflex camera is described above as the imaging apparatus of the present invention, but the device may be a camera with interchangeable imaging lens unit such as a mirrorless digital single-lens camera without the mirror box 1605, for example. In addition, the present invention can be applied to various types of imaging apparatus or electronic and electric devices including the imaging apparatus, such as a video camera with interchangeable imaging lens unit, a copying machine, a facsimile, and a scanner, in particular, a device which is required to remove dust sticking to a surface of an optical component.

Next, an electronic equipment of the present invention is described. The electronic equipment of the present invention includes a piezoelectric acoustic component including the piezoelectric element or the multilayered piezoelectric element. As the piezoelectric acoustic component, there are a speaker, a buzzer, a microphone, and a surface acoustic wave (SAW) element.

Figure 14:
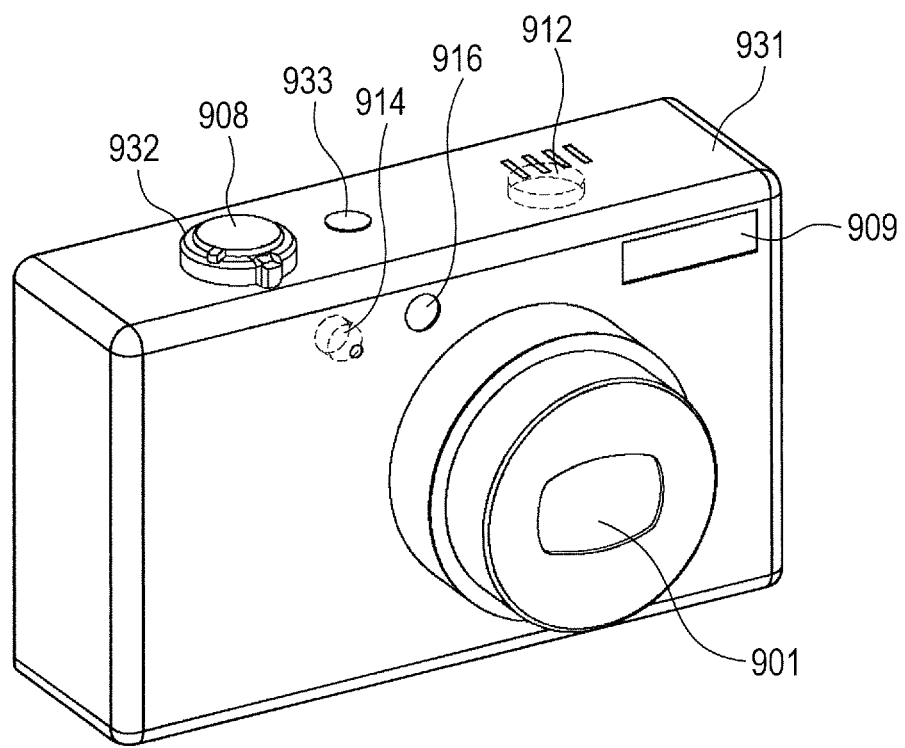
FIG. 14 is a schematic diagram illustrating an electronic equipment according to an embodiment of the present invention.

FIG. 14 is a general perspective diagram of a main body 931 of a digital camera as an example of an electronic equipment according to an exemplary embodiment of the present invention, as viewed from the front. On a front surface of the main body 931, there are disposed an optical equipment 901, a microphone 914, a stroboscopic light emission unit 909, and a fill light unit 916. Because the microphone 914 is installed in the main body, the microphone 914 is illustrated by a broken line. In the front of the microphone 914, there is a hole shape provided for collecting external sound.

A power button 933, a speaker 912, a zoom lever 932, and a release button 908 for performing a focus operation are disposed on the top surface of the main body 931. The speaker 912 is installed in the main body 931 and is illustrated by a broken line. In the front of the speaker 912, there is a hole shape provided for transmitting sound to the outside.

The piezoelectric acoustic component of the present invention is used for at least one of the microphone 914, the speaker 912, and the surface acoustic wave element.

In this case, the digital camera is described above as the electronic equipment of the present invention, but the present invention can also be applied to various types of the electronic equipment including the piezoelectric acoustic component, such as a sound reproduction device, a sound recording device, a mobile phone, or an information terminal.

As described above, the piezoelectric element and the multilayered piezoelectric element of the present invention are suitably applicable to the liquid ejection head, the liquid ejection apparatus, the ultrasonic motor, the optical equipment, the vibration device, the dust removing device, the imaging apparatus, and the electronic equipment.

Through the use of the lead-free piezoelectric ceramics including the second crystal grain of the present invention, it is possible to provide the liquid ejection head having the same or higher nozzle density and ejection velocity than the case where the piezoelectric ceramics containing lead is used.

Through the use of the lead-free piezoelectric ceramics including the second crystal grain of the present invention, it is possible to provide the liquid ejection apparatus having the same or higher ejection velocity and ejection accuracy than the case where the piezoelectric ceramics containing lead is used.

Through the use of the lead-free piezoelectric ceramics including the second crystal grain of the present invention, it is possible to provide the ultrasonic motor having the same higher driving power and durability than the case where the piezoelectric ceramics containing lead is used.

Through the use of the lead-free piezoelectric ceramics including the second crystal grain of the present invention, it is possible to provide the optical equipment having the same or higher durability and operation accuracy than the case where the piezoelectric ceramics containing lead is used.

Through the use of the lead-free piezoelectric ceramics including the second crystal grain of the present invention, it is possible to provide the vibration device having the same or higher vibration performance and durability than the case where a piezoelectric ceramics containing lead is used.

Further, through the use of the lead-free piezoelectric ceramics including the second crystal grain of the present invention, it is possible to provide the dust removing device having the same or higher dust-removing efficiency and durability than the case where a piezoelectric ceramics containing lead is used.

Through the use of the lead-free piezoelectric ceramics including the second crystal grain of the present invention, it is possible to provide the imaging apparatus having the same or higher dust-removing function than the case where a piezoelectric ceramics containing lead is used.

Through the use of the piezoelectric acoustic component using the lead-free piezoelectric ceramics including the second crystal grain of the present invention, it is possible to provide the electronic equipment having the same or higher sound producing performance than the case where a piezoelectric ceramics containing lead is used.

The piezoelectric ceramics of the present invention can be used in such a device as an ultrasonic oscillator, a piezoelectric actuator, a piezoelectric sensor, and a ferroelectric memory, as well as the liquid ejection head, the motor, and the like.

Although the detailed description is given below of the present invention by way of examples and comparative examples, the present invention is not limited to those examples.

Example 1

An example of the piezoelectric ceramics including the first crystal grain and the second crystal grain is described.

Barium titanate particles each having an average particle diameter of 100 nm (produced by Sakai Chemical Industry Co., Ltd., product name: BT-01), calcium titanate particles each having an average particle diameter of 1,000 nm, and calcium zirconate particles each having an average particle diameter of 100 nm were mixed at a molar ratio of 81.5:12.5:6. The calcium titanate particles used in this example were produced by solid state reaction. The calcium zirconate particles used in this example were produced by a hydrothermal synthesis method.

Manganese(II) acetate was caused to adhere to surfaces of the mixed particles with use of a spray dryer, to thereby obtain granulated powder. In the ICP mass spectroscopy, the content of manganese in the power was 0.18% by mass.

The content of manganese was controllable by the raw material charging ratio to the spray dryer. The granulated powder was filled into a mold to be compressed. Thus, a compact was produced.

The obtained compact was sintered to obtain a piezoelectric ceramics. The calcination atmosphere was air. First, the piezoelectric ceramics was kept at 600° C. for 3 hours to perform degreasing. Further, the piezoelectric ceramics was kept at 1,340° C. for 2 hours to perform calcination. After that, the piezoelectric ceramics was kept at 1,240° C. for 6 hours to perform calcination. The rate of temperature increase was set to 10° C./minute, and the thermocouple of the electric furnace was adjusted so that overshoot that exceeds the sintering temperature by 10° C. or more did not occur.

The surface of the piezoelectric ceramics of Example 1 was polished, and then SEM observation was performed.

Figure 15:
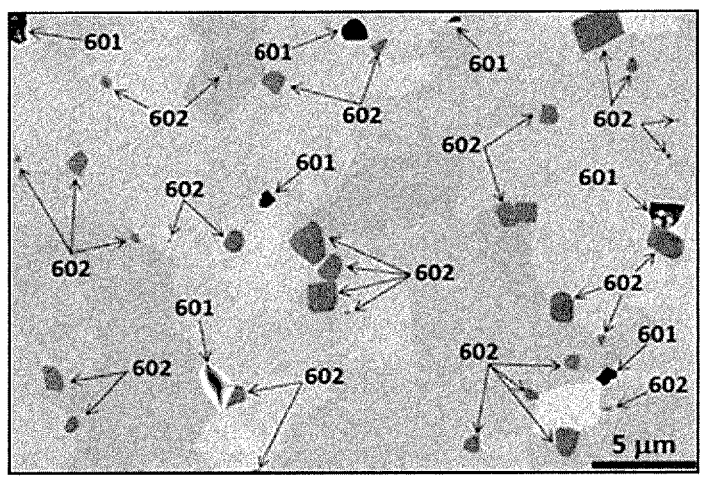
FIG. 15 shows a scanning electron microscope image of a piezoelectric ceramics of Example 1.

As for polishing, a polishing paper with a grain size of #800 and a polishing paper with a grain size of #2000 were sequentially used, and distilled water was used for cooling. In a finishing step, buffing using colloidal silica (grain diameter 60 nm) was performed. FIG. 15 shows an SEM image of the piezoelectric ceramics of Example 1. The piezoelectric ceramics includes pores 601, second crystal grains 602, and first crystal grains. In FIG. 15, parts excluding the pores 601 and the second crystal grains 602 correspond to the first crystal grains.

The average equivalent circle diameter of the first crystal grain was 7.4 μm. The average equivalent circle diameter of the second crystal grain was 1.6 μm. Further, the proportion of the second crystal grain in the observed plane was 3.0% by area.

The composition of the first crystal grain was measured by an EPMA. As a result, the composition was x=0.837, y=0.102, and z=0.061. The composition of the second crystal grain was x'=0.099, y'=0.881, and z'=0.020. Further, the content of manganese as a ceramics was 0.18% by mass. The compositions and the average equivalent circle diameters of the first crystal grain and the second crystal grain, the percentage by area of the second crystal grain, and the manganese composition of the entirety are shown in Table 1.

TABLE 1

|  | First crystal grain | | | | Second crystal grain | | | | | Entirety |
| --- | --- | --- | --- | --- | --- | --- | --- | --- | --- | --- |
|  | x | y | z | Average equivalent circle diameter (μm) | x' | y' | z' | Average equivalent circle diameter (μm) | Percentage by area | Mn content (wt %) |
| Example 1 | 0.837 | 0.102 | 0.061 | 7.4 | 0.099 | 0.881 | 0.020 | 1.6 | 3.0 | 0.18 |
| Example 2 | 0.900 | 0.040 | 0.060 | 5.3 | 0.000 | 1.000 | 0.000 | 1.8 | 4.2 | 0.18 |
| Example 3 | 0.846 | 0.055 | 0.099 | 3.8 | 0.033 | 0.917 | 0.050 | 1.1 | 2.1 | 0.25 |
| Example 4 | 0.872 | 0.051 | 0.077 | 12.4 | 0.150 | 0.834 | 0.016 | 1.8 | 3.9 | 0.12 |
| Example 5 | 0.883 | 0.062 | 0.055 | 30.0 | 0.105 | 0.882 | 0.013 | 2.0 | 1.6 | 0.40 |
| Example 6 | 0.800 | 0.120 | 0.080 | 2.0 | 0.026 | 0.944 | 0.030 | 0.2 | 4.8 | 0.06 |
| Example 7 | 0.826 | 0.122 | 0.052 | 14.3 | 0.009 | 0.980 | 0.011 | 1.5 | 0.5 | 0.18 |
| Example 8 | 0.940 | 0.030 | 0.030 | 20.5 | 0.144 | 0.850 | 0.006 | 1.7 | 1.8 | 0.18 |
| Example 9 | 0.760 | 0.130 | 0.110 | 3.2 | 0.083 | 0.876 | 0.041 | 0.3 | 0.6 | 0.18 |
| Example 10 | 0.843 | 0.116 | 0.041 | 4.6 | 0.000 | 1.000 | 0.000 | 1.5 | 5.5 | 0.18 |
| Example 11 | 0.885 | 0.042 | 0.073 | 7.7 | 0.008 | 0.943 | 0.049 | 0.4 | 0.4 | 0.18 |
| Example 12 | 0.811 | 0.118 | 0.071 | 2.2 | 0.003 | 0.971 | 0.026 | 2.5 | 4.7 | 0.18 |
| Example 13 | 0.867 | 0.073 | 0.060 | 28.6 | 0.096 | 0.889 | 0.015 | 1.8 | 1.7 | 0.41 |
| Example 14 | 0.806 | 0.115 | 0.079 | 4.1 | 0.029 | 0.936 | 0.035 | 0.5 | 4.5 | 0.03 |
| Comparative Example 1 | 0.839 | 0.101 | 0.060 | 9.6 | — | — | — | — | 0.0 | 0.18 |

COMPARATIVE EXAMPLE 1

An example of the piezoelectric ceramics including merely the first crystal grain is described.

Barium titanate particles each having an average particle diameter of 100 nm (produced by Sakai Chemical Industry Co., Ltd., product name: BT-01), calcium titanate particles each having an average particle diameter of 300 nm (produced by Sakai Chemical Industry Co., Ltd., product name: CT-03), and calcium zirconate particles each having an average particle diameter of 300 nm (produced by Sakai Chemical Industry Co., Ltd., product name: CZ-03) were mixed at a molar ratio of 84:10:6. Manganese(II) acetate was caused to adhere to surfaces of the mixed particles with use of a spray dryer, to thereby obtain granulated powder. In the ICP mass spectroscopy, the content of manganese in the power was 0.18% by mass.

The content of manganese was controllable by the raw material charging ratio to the spray dryer. The granulated powder was filled into a mold to be compressed. Thus, a compact was produced.

The obtained compact was sintered to obtain a piezoelectric ceramics. The calcination atmosphere was air. First, the piezoelectric ceramics was kept at 600° C. for 3 hours to perform degreasing. Further, the piezoelectric ceramics was kept at 1,340° C. for 2 hours to perform calcination. After that, the piezoelectric ceramics was kept at 1,240° C. for 6 hours to perform calcination. The rate of temperature increase was set to 10° C./minute, and the thermocouple of the electric furnace was adjusted so that overshoot that exceeds the sintering temperature by 10° C. or more did not occur.

The surface of the piezoelectric ceramics of Comparative Example 1 was polished, and then SEM observation was performed.

Figure 16:
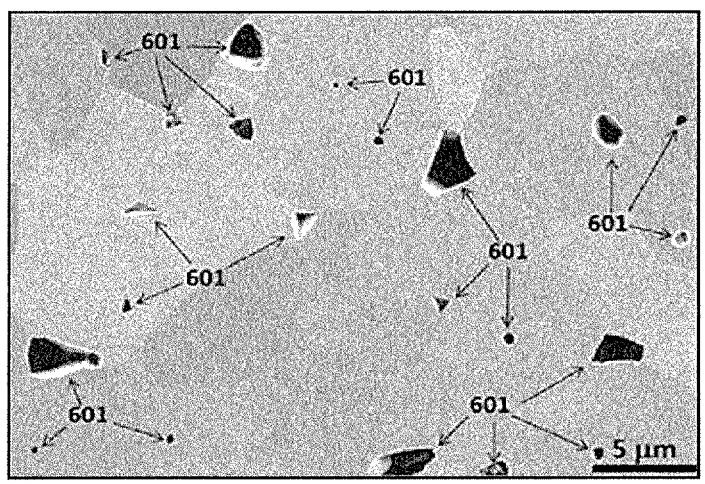
FIG. 16 shows a scanning electron microscope image of a piezoelectric ceramics of Comparative Example 1.

As for polishing, a polishing paper with a grain size of #800 and a polishing paper with a grain size of #2000 were sequentially used, and distilled water was used for cooling. In a finishing step, buffing using colloidal silica (grain diameter 60 nm) was performed. FIG. 16 shows an SEM image of the piezoelectric ceramics of Comparative Example 1. The piezoelectric ceramics includes pores 601 and first crystal grains. In FIG. 16, parts excluding the pore 601 correspond to the first crystal grains. There were no second crystal grains as observed in Example 1. The average equivalent circle diameter of the first crystal grain was 9.6 µm. The composition of the first crystal grain was measured similarly to Example 1. As a result, the composition was x=0.839, y=0.101, and z=0.060. Further, the content of manganese as a ceramics was 0.18% by mass.

The results of the composition analysis, and the average equivalent circle diameter of the first crystal grain are shown in Table 1.

Examples 2 to 14

Piezoelectric ceramics were produced similarly to Example 1 except that the molar ratio of the raw material particles (barium titanate particle, calcium titanate particle, and calcium zirconate particle) and the amount of manganese doped were changed.

The compositions, the average equivalent circle diameters, and the percentages by area, which were obtained similarly to Example 1, are shown in Table 1.
(Measurement of Qm)

On front and rear surfaces of each piezoelectric ceramics obtained in Examples 1 to 14 and Comparative Example 1, gold electrodes were formed by a DC sputtering method as electrodes. The piezoelectric ceramics with the electrodes were cut and processed. Thus, a plate-like ceramics of 12 mm×3 mm×1 mm was produced.

The plate-like ceramics was subjected to polarization treatment in silicone oil. The oil temperature was 100° C., the polarization voltage was DC 1 kV, and the voltage application time was 30 minutes.

The plate-like ceramics subjected to polarization treatment was used for piezoelectric constant measurement. Specifically, an impedance analyzer device (Agilent Technologies, Inc., product name: 4294A) was used to measure the frequency dependence of the impedance of the ceramic sample. Then, the piezoelectric constant $d_{31}$ (pm/V) was obtained based on the observed resonance frequency and antiresonance frequency. The piezoelectric constant $d_{31}$ is a negative constant, and a larger absolute value means a higher piezoelectric performance. Further, simultaneously, the mechanical quality factor Qm can be calculated.

The results are shown in Table 2.
(Measurement of Mechanical Strength)

The strength test was carried out based on the JIS standards (JIS R 1601, testing method for flexural strength of fine ceramics at room temperature). The piezoelectric ceramics obtained in each of Examples 1 to 14 and Comparative Example 1 was cut and processed, and thus a test piece of 36 mm×3 mm×4 mm was produced. The test piece was subjected to four-point bending test and its fracture load was measured. Then, the flexural strength was calculated based on the fracture load. The results are shown in Table 2.

TABLE 2

|  | Piezoelectric $d_{31}$ constant (pm/V) | Qm | Flexural strength (MPa) |
| --- | --- | --- | --- |
| Example 1 | −80 | 1,200 | 140 |
| Example 2 | −79 | 1,300 | 152 |
| Example 3 | −82 | 1,500 | 125 |
| Example 4 | −78 | 1,100 | 136 |
| Example 5 | −78 | 1,200 | 130 |
| Example 6 | −81 | 1,100 | 139 |
| Example 7 | −79 | 1,200 | 123 |
| Example 8 | −73 | 1,200 | 135 |
| Example 9 | −74 | 1,200 | 122 |
| Example 10 | −76 | 1,300 | 161 |
| Example 11 | −77 | 1,200 | 121 |
| Example 12 | −75 | 1,200 | 139 |
| Example 13 | −76 | 1,500 | 134 |
| Example 14 | −72 | 1,000 | 138 |
| Comparative Example 1 | −69 | 800 | 106 |

As described above, it was confirmed that, because the second crystal grain coexisted, the Qm and the mechanical strength of the piezoelectric ceramics were enhanced.
(Production and Evaluation of Multilayered Piezoelectric Element)

The multilayered piezoelectric element of the present invention was produced.

Example 15

The barium titanate particles each having an average particle diameter of 100 nm (produced by Sakai Chemical Industry Co., Ltd., product name: BT-01), calcium titanate particles each having an average particle diameter of 1,000 nm, calcium zirconate particles each having an average particle diameter of 100 nm, and trimanganese tetraoxide ($Mn_3O_4$) were weighed to obtain the composition of Table 1 described in Example 1. The weighed raw material powders were mixed, and mixing was performed by a ball mill for one night, to thereby obtain mixed powder.

PVB was added and mixed to the obtained mixed powder. After that, a sheet was formed by a doctor blade method to obtain a green sheet having a thickness of 50 µm.

A conductive paste for the internal electrode was printed on the above-mentioned green sheet. As the conductive paste, an alloy paste of Ag 60%-Pd 40% was used. Nine green sheets each having the conductive paste coated thereon were stacked, to thereby obtain a multilayered body. The multilayered body was first kept at 600° C. for 3 hours to perform degreasing. Further, the multilayered body was kept at 1,320° C. for 2 hours to perform calcination. After that, the multilayered body was kept at 1,220° C. for 6 hours, and thus the piezoelectric ceramics was obtained.

Subsequently, the surface of the piezoelectric ceramics was polished, and then SEM observation was performed. As for polishing, a polishing paper with a grain size of #800 and a polishing paper with a grain size of #2000 were sequentially used, and distilled water was used for cooling. In a finishing step, buffing using colloidal silica (grain diameter 60 nm) was performed. The piezoelectric ceramics included the pores, the first crystal grains, and the second crystal grains.

The average equivalent circle diameter of the first crystal grain was 6.1 µm. The average equivalent circle diameter of the second crystal grain was 1.1 µm. Further, the proportion of the second crystal grain in the observed plane was 4.4% by area.

The composition of the first crystal grain was measured by an EPMA. As a result, the composition was x=0.837, y=0.102, and z=0.061. The composition of the second crystal grain was x'=0.099, y'=0.881, and z'=0.020. Further, the content of manganese as a ceramics was 0.18% by mass.

The piezoelectric ceramics was cut into a size of 12 mm×3 mm, and then its side surface was polished. After that, a pair of external electrodes (first electrode and second electrode, gold electrodes) for causing the internal electrode to alternately short-circuit was formed by DC sputtering. Thus, the multilayered piezoelectric element as illustrated in FIG. 2B was produced.

The internal electrode of the obtained multilayered piezoelectric element was observed. As a result, Ag—Pd as an electrode material was formed alternately to the piezoelectric material.

In order to evaluate the piezoelectric constant, the sample was subjected to polarization treatment. Specifically, the sample was heated at 100° C. in silicone oil. The polarization voltage of DC 1 kV/mm was applied for 30 minutes.

The piezoelectric property of the obtained multilayered piezoelectric element was evaluated. As a result, a sufficient insulation property was obtained, and a sufficient piezoelectric property equivalent to that of the piezoelectric ceramics of Example 1 was obtained.

Example 16

Mixed powder was produced by a method similar to that of Example 15. The obtained mixed powder was calcined while being rotated in the atmosphere at 1,000° C. for 3 hours. Thus, calcined powder was obtained. A ball mill was used to disintegrate the obtained calcined powder. PVB was added and mixed to the obtained calcined powder, and then a doctor blade method was used for sheet formation. Thus, a green sheet having a thickness of 50 μm was obtained. A conductive paste for the internal electrode was printed on the above-mentioned green sheet. As the conductive paste, an Ni paste was used. Nine green sheets each having the conductive paste coated thereon were stacked, and the obtained multilayered body was subjected to thermo-compression bonding.

The multilayered body subjected to thermo-compression bonding was calcinated in a tubular furnace. The calcination was performed in the atmosphere until the temperature reached to 300° C. to perform degreasing. After that, the atmosphere was changed to a reducing atmosphere (H2:N2=2:98, oxygen level $2\times10^{-6}$ Pa), and the multilayered body was kept in the atmosphere at 1,320° C. for 5 hours. After that, the multilayered body was kept at 1,220° C. for 6 hours. In the temperature decreasing process, when the temperature became 1,000° C. or less, the oxygen level was changed to 30 Pa and the multilayered body was cooled until room temperature. Thus, the piezoelectric ceramics was obtained.

Subsequently, the surface of the piezoelectric ceramics was polished, and then SEM observation was performed. As for polishing, a polishing paper with a grain size of #800 and a polishing paper with a grain size of #2000 were sequentially used, and distilled water was used for cooling. In a finishing step, buffing using colloidal silica (grain diameter 60 nm) was performed. The piezoelectric ceramics included the pores, the first crystal grains, and the second crystal grains.

The average equivalent circle diameter of the first crystal grain was 5.9 μm. The average equivalent circle diameter of the second crystal grain was 1.6 μm. Further, the proportion of the second crystal grain in the observed plane was 3.9% by area.

The composition of the first crystal grain was measured by an EPMA. As a result, the composition was x=0.837, y=0.102, and z=0.061. The composition of the second crystal grain was x'=0.099, y'=0.881, and z'=0.020. Further, the content of manganese as a ceramics was 0.18% by mass.

The piezoelectric ceramics was cut into a size of 12 mm×3 mm, and then its side surface was polished. After that, a pair of external electrodes (first electrode and second electrode, gold electrodes) for causing the internal electrode to alternately short-circuit was formed by DC sputtering. Thus, the multilayered piezoelectric element as illustrated in FIG. 2B was produced.

The internal electrode of the obtained multilayered piezoelectric element was observed. As a result, Ag—Pd as an electrode material was formed alternately to the piezoelectric material.

In order to evaluate the piezoelectric constant, the sample was subjected to polarization treatment. Specifically, the sample was heated at 100° C. in silicone oil. The polarization voltage of DC 1 kV/mm was applied for 30 minutes.

The piezoelectric property of the obtained multilayered piezoelectric element was evaluated. As a result, a sufficient insulation property was obtained, and a sufficient piezoelectric property equivalent to that of the piezoelectric ceramics of Example 1 was obtained.

Example 17

Through the use of the same piezoelectric element as Example 1, the liquid ejection head illustrated in FIGS. 3A and 3B was manufactured. It was confirmed that ink was ejected in accordance with an input electric signal.

Example 18

Through the use of the same liquid ejection head as Example 17, the liquid ejection apparatus illustrated in FIG. 4 was manufactured. It was confirmed that ink was ejected on a recording medium in accordance with an input electric signal.

Example 19

Through the use of the same piezoelectric element as Example 1, the ultrasonic motor illustrated in FIG. 6A was manufactured. It was confirmed that the motor rotated in accordance with an applied alternating voltage.

Example 20

Through the use of the same ultrasonic motor as Example 19, the optical equipment illustrated in FIGS. 7A and 7B was manufactured. It was confirmed that the automatic focus operation was performed in accordance with an applied alternating voltage.

Example 21

Through the use of the same piezoelectric element as Example 1, the dust removing device illustrated in FIGS. 9A and 9B was manufactured. Plastic beads were scattered, and an alternating voltage was applied. Then, it was confirmed that the dust was removed with sufficient dust removing efficiency.

Example 22

Through the use of the same dust removing device as Example 21, the imaging apparatus illustrated in FIG. 12 was manufactured. During operation, the dust on the surface of the imaging unit was sufficiently removed, and an image without a dust defect was obtained.

Example 23

Through the use of the same multilayered piezoelectric element as Example 15, the liquid ejection head illustrated in FIGS. 3A and 3B was manufactured. It was confirmed that ink was ejected in accordance with an input electric signal.

Example 24

Through the use of the same liquid ejection head as Example 23, the liquid ejection apparatus illustrated in FIG. 4 was manufactured. It was confirmed that ink was ejected on a recording medium in accordance with an input electric signal.

Example 25

Through the use of the same multilayered piezoelectric element as Example 15, the ultrasonic motor illustrated in FIG. 6B was manufactured. It was confirmed that the motor rotated in accordance with an applied alternating voltage.

Example 26

Through the use of the same ultrasonic motor as Example 25, the optical equipment illustrated in FIGS. 7A and 7B was manufactured. It was confirmed that the automatic focus operation was performed in accordance with an applied alternating voltage.

Example 27

Through the use of the same multilayered piezoelectric element as Example 15, the dust removing device illustrated in FIGS. 9A and 9B was manufactured. Plastic beads were scattered, and an alternating voltage was applied. Then, it was confirmed that the dust was removed with sufficient dust removing efficiency.

Example 28

Through the use of the same dust removing device as Example 27, the imaging apparatus illustrated in FIG. 12 was manufactured. During operation, the dust on the surface of the imaging unit was sufficiently removed, and an image without a dust defect was obtained.

Example 29

Through the use of the same multilayered piezoelectric element as Example 15, the electronic equipment illustrated in FIG. 14 was manufactured. It was confirmed that the speaker operated in accordance with an applied alternating voltage.

Industrial Applicability

According to the present invention, it is possible to provide the lead-free piezoelectric ceramics having enhanced Qm and mechanical strength. The lead-free piezoelectric ceramics of the present invention is environmentally clean, and hence can be utilized without problems in a device which uses a piezoelectric ceramics, such as a liquid ejection head, an ultrasonic motor, and a dust removing device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-081216, filed Mar. 30, 2012, which is hereby incorporated by reference herein in its entirety.

REFERENCE SIGNS LIST 1 first electrode
2 piezoelectric ceramics
3 second electrode
101 piezoelectric element
102 individual liquid chamber
103 diaphragm
104 liquid chamber partition wall
105 ejection orifice
106 communicating hole
107 common liquid chamber
108 buffer layer
1011 first electrode
1012 piezoelectric ceramics
1013 second electrode
201 oscillator
202 rotor
203 output shaft
204 oscillator
205 rotor
206 spring
2011 elastic ring
2012 piezoelectric element
2013 organic adhesive
2041 metal elastic body
2042 multilayered piezoelectric element
310 dust removing device
320 diaphragm
330 piezoelectric element
331 piezoelectric ceramics
332 first electrode
333 second electrode
336 first electrode plane
337 second electrode plane
51 first electrode
53 second electrode
54 piezoelectric ceramic layer
55 internal electrode
501 first electrode
503 second electrode
504 piezoelectric ceramic layer
505 internal electrode
506a external electrode
506b external electrode
1601 camera main body
1602 mount portion
1605 mirror box
1606 main mirror
200 shutter unit
300 main body chassis
400 imaging unit
701 front unit lens
702 rear unit lens (focus lens)
711 attachable/detachable mount
712 fixed barrel
713 linear guide barrel
714 front unit barrel
715 cam ring 716 rear unit barrel
717a cam roller
717b cam roller
718 axial screw
719 roller
720 rotation transmission ring
722 roller
724 manual focus ring
725 ultrasonic motor
726 wave washer
727 ball race
728 focus key
729 joining member
732 washer
733 low friction sheet
881 liquid ejection apparatus
882 sheathing
883 sheathing
884 sheathing
885 sheathing
887 sheathing
890 recovery unit
891 recording unit
892 carriage
896 device main body
897 automatic feeding unit
898 ejection orifice
899 conveying unit
901 optical equipment
908 release button
909 stroboscopic light emission unit
912 speaker
914 microphone
916 fill light unit
931 main body
932 zoom lever
933 power button
601 pore
602 second crystal grain

The invention claimed is:

1. A piezoelectric ceramics, comprising a first crystal grain and a second crystal grain,
wherein the first crystal grain has an average equivalent circle diameter of 2 μm to 30 μm,
wherein the first crystal grain includes a perovskite-type metal oxide represented by general formula (1) as a main component, and the second crystal grain includes a perovskite-type metal oxide represented by general formula (2) as a main component:

$$xBaTiO_3\text{-}yCaTiO_3\text{-}zCaZrO_3; \text{ and} \quad (1)$$

$$x'BaTiO_3\text{-}y'CaTiO_3\text{-}z'CaZrO_3, \quad (2)$$

provided that x, y, z, x', y', and z' satisfy x+y+z=1, x'+y'+z'=1, 0≤x'≤0.15, 0.85≤y'≤1, 0≤z'≤0.05, x>x', 0<y<y', and z>0, and
wherein when the piezoelectric ceramics is polished, a ratio of an area of the first crystal grain in a polished surface of the piezoelectric ceramics is larger than a ratio of an area of the second crystal grain in the polished surface.

2. The piezoelectric ceramics according to claim 1, wherein the first crystal grain has a composition satisfying 0.80<x<0.90, 0.04<y<0.12, and 0.04<z<0.10.

3. The piezoelectric ceramics according to claim 1, wherein a proportion of the perovskite-type metal oxide represented by the general formula (2) when one of a surface and a cross section of the piezoelectric ceramics is observed is from 0.5% by area to 5% by area.

4. The piezoelectric ceramics according to claim 1, wherein the average equivalent circle diameter of the first crystal grain is larger than an average equivalent circle diameter of the second crystal grain.

5. The piezoelectric ceramics according to claim 4, wherein the average equivalent circle diameter of the second crystal grain is 200 nm to 2 μm.

6. The piezoelectric ceramics according to claim 1, wherein the first crystal grain contains Mn in an amount of 0.05% by weight to 0.40% by weight.

7. A piezoelectric element, comprising:
a first electrode;
a piezoelectric ceramics; and
a second electrode,
wherein the piezoelectric ceramics comprises the piezoelectric ceramics according to claim 1.

8. A multilayered piezoelectric element, comprising a piezoelectric ceramic layer and an electrode layer including an internal electrode, which are alternately stacked,
wherein the piezoelectric ceramic layer is formed of the piezoelectric ceramics according to claim 1.

9. The multilayered piezoelectric element according to claim 8,
wherein the internal electrode contains Ag and Pd, and
wherein a weight ratio M1/M2 of a content weight M1 of the Ag to a content weight M2 of the Pd satisfies 0.25<M1/M2<4.0.

10. The multilayered piezoelectric element according to claim 8, wherein the internal electrode contains at least one kind of Ni and Cu.

11. A liquid ejection head, comprising:
a liquid chamber comprising a vibration portion including the piezoelectric element according to claim 7; and
an ejection orifice communicating to the liquid chamber.

12. A liquid ejection apparatus, comprising:
a conveying unit for a recording medium; and
the liquid ejection head according to claim 11.

13. An ultrasonic motor, comprising:
a vibration body including the piezoelectric element according to claim 7; and
a moving body to be brought into contact with the vibration body.

14. An optical equipment, comprising a drive unit including the ultrasonic motor according to claim 13.

15. A vibration device, comprising a vibration body including the piezoelectric element according to claim 7.

16. A dust removing device, comprising the vibration device according to claim 15.

17. An imaging apparatus, comprising:
the dust removing device according to claim 16; and
an imaging element unit,
wherein the dust removing device includes a vibration member disposed on a light receiving surface side of the imaging element unit.

18. An electronic equipment, comprising a piezoelectric acoustic component including the piezoelectric element according to claim 7.

19. A liquid ejection head, comprising:
a liquid chamber comprising a vibration portion including the multilayered piezoelectric element according to claim 8; and
an ejection orifice communicating to the liquid chamber.

20. A liquid ejection apparatus, comprising:
a conveying unit for a recording medium; and
the liquid ejection head according to claim 19.

21. An ultrasonic motor, comprising:
   a vibration body including the multilayered piezoelectric element according to claim 8; and
   a moving body to be brought into contact with the vibration body.

22. An optical equipment, comprising a drive unit including the ultrasonic motor according to claim 21.

23. A vibration device, comprising a vibration body including the multilayered piezoelectric element according to claim 8.

24. A dust removing device, comprising the vibration device according to claim 23.

25. An imaging apparatus, comprising:
   the dust removing device according to claim 24; and
   an imaging element unit,
   wherein the dust removing device includes a vibration member disposed on a light receiving surface side of the imaging element unit.

26. An electronic equipment, comprising a piezoelectric acoustic component including the multilayered piezoelectric element according to claim 8.

* * * * *